United States Patent [19]
Motonami et al.

[11] Patent Number: 5,831,323
[45] Date of Patent: Nov. 3, 1998

[54] SEMICONDUCTOR DEVICE HAVING AN ELEMENT ISOLATING OXIDE FILM AND METHOD OF MANUFACTURING THE SAME

[75] Inventors: Kaoru Motonami; Shigeru Shiratake; Hiroshi Matsuo; Yuichi Yokoyama; Kenji Morisawa; Ritsuko Gotoda; Takaaki Murakami; Satoshi Hamamoto; Kenji Yasumura; Yasuyoshi Itoh, all of Hyogo, Japan

[73] Assignee: Mitsubishi Denki Kabushiki Kaisha, Tokyo, Japan

[21] Appl. No.: 601,662

[22] Filed: Feb. 14, 1996

[30] Foreign Application Priority Data

May 16, 1995 [JP] Japan .................................. 7-117060

[51] Int. Cl.⁶ .................................................. H01L 29/00
[52] U.S. Cl. .................... 257/506; 257/333; 257/647; 257/395; 438/297
[58] Field of Search ..................... 257/506, 507, 257/508, 509, 333, 395, 647; 438/444, 439, 362, 225, 297, 232, 148, 443

[56] References Cited

U.S. PATENT DOCUMENTS

| | | | |
|---|---|---|---|
| 4,271,423 | 6/1981 | Kang | 257/333 |
| 4,539,744 | 9/1985 | Burton | 257/506 |
| 4,622,096 | 11/1986 | Dil et al. | 257/506 |
| 4,952,525 | 8/1990 | van der Plas | 438/443 |
| 5,455,438 | 10/1995 | Hashimoto et al. | 257/391 |
| 5,548,147 | 8/1996 | Mei | 257/395 |
| 5,554,879 | 9/1996 | Poulin | 257/506 |
| 5,686,346 | 11/1997 | Duane | 438/443 |

FOREIGN PATENT DOCUMENTS

| | | | |
|---|---|---|---|
| 60-98640 | 6/1985 | Japan . | |
| 61-189653 | 8/1986 | Japan | 257/506 |
| 62-72145 | 4/1987 | Japan . | |
| 62-263658 | 11/1987 | Japan | 257/506 |
| 63-21848 | 1/1988 | Japan . | |
| 1-243447 | 9/1989 | Japan . | |
| 2-312234 | 12/1990 | Japan . | |
| 5-218192 | 8/1993 | Japan . | |
| 5-267619 | 10/1993 | Japan | 257/506 |
| 6-28282 | 4/1994 | Japan . | |
| WO 87/01238 | 8/1985 | WIPO | 257/506 |

OTHER PUBLICATIONS

Patric Deroux–Dauhphin et al., "Physical and Electrical Characterization of a SILO Isolation Structure," IEEE Transactions on Electron Devices, vol. ED–32, No. 11, Nov. 1985, pp. 2392–2398.

Hong–Hsiang Tsai et al., "An Evaluation of FUROX Isolation Technology for VLSI/nMOSFET Fabrication," IEEE Transactions on Electron Devices, vol. 35, No. 3, Mar. 1988, pp. 275–284.

P.A. van der Plas et al, Field Isolation Process for Submission CMOS, VSLI Symposium, 1987, pp. 19–20.

*Primary Examiner*—Olik Chaudhuri
*Assistant Examiner*—Phat X. Cao
*Attorney, Agent, or Firm*—McDermott, Will & Emery

[57] ABSTRACT

There are provided a semiconductor device, which includes an element isolating oxide film having a good upper flatness, and a method of manufacturing the same. Assuming that $t_G$ represents a thickness of a gate electrode layer 6, a height $t_U$ to an upper surface of a thickest portion of element isolating oxide film 4 from an upper surface of a gate insulating film 5 and an acute angle $\theta i$ defined between the upper surfaces of element isolating oxide film 4 and gate insulating film are set within ranges expressed by the formula of $\{\theta i, t_U | 0 \leq \theta i \leq 56.6°, 0 \leq t_U \leq 0.82 t_G\}$. Thereby, an unetched portion does not remain at an etching step for patterning the gate electrode layer to be formed later. This prevents short-circuit of the gate electrode. Since the element isolating oxide film has the improved flatness, a quantity of overetching in an active region can be reduced at a step of patterning the gate electrode. This prevents shaving of the gate insulating film and the underlying substrate surface.

5 Claims, 22 Drawing Sheets

SEMICONDUCTOR DEVICE HAVING AN ELEMENT ISOLATING OXIDE FILM AND METHOD OF MANUFACTURING THE SAME

BACKGROUND OF THE INVENTION

1. Field of the Invention

The present invention relates to a semiconductor device and a method of manufacturing the same, and in particular to a semiconductor device having an element isolating oxide film and a method of manufacturing the same.

2. Description of the Background Art

A LOCOS (Local Oxidation of Silicon) method has been known as a conventional method of forming element isolating regions in VLSIs. Referring to FIGS. 24–26, a conventional LOCOS method will be described below. First, as shown in FIG. 24, a silicon oxide film ($SiO_2$ film) 2 having a thickness from about 300 to about 500 Å is formed on a silicon substrate 1 of, e.g., P-type. A silicon nitride film ($Si_3N_4$ film) 3 having a thickness from about 500 to about 100 Å and forming a anti-oxidation film is formed at a predetermined region on silicon oxide film 2. Using silicon nitride film 3 as a mask, thermal oxidation is performed to form a field oxide film (element isolating oxide film) 4 having a large thickness as shown in FIG. 25. Then, nitride film 3 is removed by etching, and oxide film 2 is removed, so that a configuration shown in FIG. 26 is formed.

However, the oxidation for forming field oxide film 4 progresses not only in a vertical direction with respect to silicon substrate 1 but also in a parallel direction. This is due to the fact that silicon oxide film 2 not having sufficient anti-oxidation properties is used as a base film under silicon nitride film 3. Due to employment of silicon oxide film 2, a so-called bird's beak 4a is formed at an end of field oxide film 4, which impedes densification of elements.

A B/B length (see FIG. 25) which is a length of bird's beak 4a can be represented with a distance to an end of nitride film 3 from a point at which the thickness of oxide film 2 starts to vary. The B/B length is substantially proportional to the film thickness of field oxide film 4. It is desirable to minimize the B/B length for densification of the device. For example, if a structure is to be miniaturized to have an active region (i.e., silicon nitride film 3) of about 1 μm or less in width, the B/B length must be from about 0.15 to about 0.10 μm. In order to achieve the B/B length from about 0.15 to about 0.10 μm, however, the thickness of field oxide film 4 must be from about 1000 to about 1500 Å. However, such a small thickness of field oxide film 4 impairs electrical isolating properties.

In the prior art, as described above, reduction of the B/B length disadvantageously impairs the isolating properties of field oxide film 4. Consequently, it is difficult to reduce sufficiently the B/B length while maintaining sufficient isolating properties.

In the conventional filed oxide film 4 shown in FIG. 26, the following problem arises in connection with flatness of its upper surface. θi and $t_U$ are parameters representing the upper flatness of field oxide film 4. Referring to FIGS. 27 and 28, θi and $t_U$ will be described below. A structure shown in FIG. 27 is formed in such a manner that a gate oxide film 5 is formed after the step shown in FIG. 26, and further a polycrystalline silicon layer 6, which will form a gate electrode, is formed by a low pressure CVD method. FIG. 28 is a perspective view of the structure shown in FIG. 26.

Referring to FIGS. 27 and 28, $t_U$ represents a thickness or distance from a base, which is an upper surface gate oxide film 5, to an upper surface of a thickest portion of field oxide film 4, and $t_{OX}$ and $t_G$ represent film thicknesses of gate oxide film 5 and polycrystalline silicon layer 6, respectively. θi represents an angle defined between upper surface 51 of gate oxide film 5 and a tangent 401 at a given point 402 in an area between a point at which film thickness $t_{OX}$ of gate oxide film 5 starts to increase and a point at which field oxide film 4 has the largest thickness.

Film thickness $t_{XG}$ of polycrystalline silicon layer 6 located at the bird's beak of field oxide film 4 satisfies a relationship of $t_{XG}=t_G/\cos θi$. Therefore, the film thicknesses satisfy a relationship of $t_{XG}>t_G$. When patterning gate oxide film 5 and polycrystalline silicon layer 6 for forming the gate electrode, polycrystalline silicon layer 6 having thickness of $t_G$ is to be removed at the active region, while polycrystalline silicon layer 6 having thickness of $t_{XG}$ is to be removed at the bird's beak. Thus, the active region is excessively etched. In this case, if a selection ratio of polycrystalline silicon layer 6 with respect to gate oxide film 5 is small and gate oxide film 5 is thin, such a disadvantage occurs that gate oxide film 5 at the active region is shaved. This results in a problem that the surface of semiconductor substrate 1 is exposed and shaved. This adversely affect the device.

Reduction of the thickness of gate oxide film 5 is inevitably required for reducing the power supply voltage of the semiconductor device. Also, it is difficult to increase a selection ratio. Therefore, it is required to provide field oxide film 4 of a flat structure in which θi and $t_U$ described above are minimized. According to the conventional manufacturing process shown in FIGS. 24 to 26, however, it is difficult to form field oxide film 4 having reduced θi and $t_U$ and thus having good upper flatness. Accordingly, the surface of semiconductor substrate 1 is shaved at the step of etching the polycrystalline silicon layer 6 forming the gate electrode, and thus the device is adversely affected as already described.

In the prior art, as described before, it is difficult to reduce the length of the bird's beak while maintaining intended isolating properties, because silicon oxide film 2 which is susceptible to oxidation is used as the base film under silicon oxynitride film 3. Also, stable processing of the gate electrode is difficult because it is difficult to improve the upper flatness θi and $t_U$) of field oxide film 4.

Meanwhile, a polybuffer LOCOS method has been known as a method by which the bird's beak length (B/B length) can be reduced while preventing reduction of the isolating properties of field oxide film 4. According to this polybuffer LOCOS method, an oxide film is formed on a semiconductor substrate, and a polycrystalline silicon layer is formed on the oxide film. A nitride film is formed at a predetermined region on an upper surface of the polycrystalline silicon layer. According to this method, the polycrystalline silicon layer relieves a stress which is generated when forming the field oxide film, so that the thickness of the nitride film can be increased. Consequently, the bird's beak length can be reduced.

According to this method, however, field oxide film 4 includes a negative angle portion 10 of a configuration shown in FIG. 29. Negative angle portion 10 is a portion at which θi is 90° or more.

Negative angle portion 10 causes such a disadvantage that an unetched portion remains at the negative angle portion 10 after the etching step for patterning the polycrystalline silicon layer 6. This may cause a short circuit of the gate electrode. A process of generation of negative angle portion 10 will be described below with reference to FIGS. 30–41.

FIGS. 30–41 show simulated process of generation of negative angle portion 10.

As shown in FIG. 30, silicon oxide film 2 having a thickness from about 300 to about 500 Å is formed on, e.g., P-type silicon substrate 1, and a polycrystalline silicon layer 7 having a thickness from about 500 to about 1000 Å is formed thereon. Silicon nitride film 3 having a thickness from about 1000 to 2000 Å is selectively formed at a predetermined region on polycrystalline silicon layer 7. Using this silicon nitride film 3 as a mask, thermal oxidation is performed, in which case variation with time occurs as shown in FIGS. 30 through 41.

Referring to FIGS. 30 to 41, it can be understood that negative angle portion 10 is generated due to oxidation of polycrystalline silicon layer 7 located at a side end of silicon nitride film 3. After the step shown in FIG. 41, nitride film 3, polycrystalline silicon layer 7 and gate oxide film 2 are removed, and then polycrystalline silicon layer 6 forming the gate electrode is formed as shown in FIG. 29. In the conventional polybuffer LOCOS method, as described above, the polycrystalline silicon layer 7 is used as a buffer film, so that negative angle portion 10 is formed, which results in the problem that short-circuit of the gate electrode may occur.

As another method of reducing the bird's beak length (B/B length), such a method has been proposed that LOCOS oxidation is performed with a two-layer structure formed of a silicon oxynitride ($SiO_xN_y$) film and a silicon nitride film ($Si_3N_4$ film). This is disclosed in "1987 VLSI Symposium", pp. 19–20. According to this method, however, a white ribbon 12 made of nitride is formed on the substrate surface as shown in FIG. 42. The cause of generation of white ribbon 12 will be described below. During oxidation process shown in FIG. 42, reaction represented by the following formula (1) occurs between $Si_3N_4$ and water contained in oxidation atmosphere at the surface of silicon nitride film 3 at the end of field oxide film 4.

$$Si_3N_4 + H_2O \rightarrow SiO_2 + NH_3 \qquad (1)$$

Thereby, ammonia ($NH_3$) is generated, and moves through field oxide film 4 to the silicon substrate surface under silicon oxynitride ($SiO_xN_y$) film 31 located under silicon nitride film 3. At the silicon substrate surface, the ammonia reacts with silicon to produce nitride, i.e., white ribbon 12. In this case, since white ribbon 12 is covered with silicon oxynitride film 31, it is not removed by the etching effected for removing silicon nitride film 3. Also, white ribbon 12 is not removed by the etching effected for removing silicon oxynitride film 31.

Accordingly, a problem occurs at the later step of forming the gate oxide film on the silicon substrate surface, and specifically a stable gate oxide film cannot be formed because white ribbon 12 impedes the oxidation. FIG. 43 shows a structure after removal of silicon nitride film 3 and silicon oxynitride film 31. According to the conventional method of performing LOCOS oxidation with the two-layer structure formed of silicon oxynitride film 31 and silicon nitride film 3 as described above, white ribbon 12 is formed, which results in a problem that the gate oxide film of MOSFET cannot be formed uniformly.

According to "1987 VLSI Symposium", pp. 19–20 described before, such a method is employed that etchback is effected after the silicon oxide film is formed on the entire surface of the field oxide film in order to improve the upper flatness of the field oxide film. According to this method, such a disadvantage occurs that the end of the field oxide film is hollowed deep at an etchback step. The reason for this is as follows. Since a stress concentrates at the end of the field oxide film, the end is etched more rapidly than the other portions. Therefore, etching of the end of the field oxide film progresses more rapidly that the other portions during the etchback, resulting in the deep hollow. As a result, it is actually difficult to improve the upper flatness of the field oxide film.

Although various methods have been proposed for reducing the bird's beak length and improving the upper flatness of the field oxide film as described above, the foregoing problems arise in these methods.

SUMMARY OF THE INVENTION

An object of the invention is to provide a semiconductor device of a structure including an element isolating oxide film which has a good upper flatness.

Another object of the invention is to provide a semiconductor device of a structure having an element isolating oxide film which does not adversely affect device characteristics.

Still another object of the invention is to provide a method of manufacturing a semiconductor device allowing easy manufacturing of an element isolating oxide film, which has a good upper flatness and in which a bird's beak is reduced.

A semiconductor device according to an aspect of the invention includes an element isolating oxide film, a gate insulating film and a gate electrode layer. The element isolating oxide film is formed at a predetermined region on a main surface of a semiconductor substrate. The gate insulating film is formed at a predetermined region in a region on the main surface of the semiconductor substrate not covered with the element isolating oxide film. The gate electrode layer extends over the element isolating oxide film and the gate insulating film. $\theta i$ and $t_U$ are within the following ranges, where $t_G$ is a thickness of the gate electrode layer, $t_U$ is a height from an upper surface of the gate insulating film to an upper surface of a thickest portion of the element isolating oxide film, and $\theta i$ is an acute angle between the upper surface of the element isolating oxide film and the upper surface of the gate insulating film:

$0 \leq \theta i \leq 56.6°$ $0 \leq t_U \leq 0.82 t_G$

The semiconductor device of the above aspect improves the upper flatness of the element isolating oxide film as compared with the prior art. Consequently, an unetched portion does not remain at a later etching step for patterning the gate electrode layer formed on the element isolating oxide film. Thereby, short-circuit of a gate electrode is prevented. Since the element isolating oxide film has the improved flatness, a quantity of overetching in an active region can be reduced at a step of patterning the gate electrode. This prevents shaving of the gate insulating film and an underlying substrate surface.

According to a method of manufacturing a semiconductor device of another aspect, a silicon oxide film is formed on a semiconductor substrate. A silicon oxynitride film is formed on the silicon oxide film. A silicon nitride film is formed on the silicon oxynitride film. Etching is effected on the silicon nitride film, the silicon oxynitride film and the silicon oxide film for patterning them. Etching is effected on a surface of the semiconductor substrate exposed by the patterning to form a concavity at the surface of the semiconductor substrate. The concavity at the semiconductor substrate is selectively oxidized to form an element isolating oxide film.

According to the method of manufacturing the semiconductor device of the above aspect, three layers, i.e., the silicon oxide film, silicon oxynitride film and silicon nitride film are successively formed on the semiconductor substrate, and then the element isolating oxide film is formed using the three-layer structure, so that the silicon nitride film is spaced from the semiconductor substrate by a longer distance than that in the conventional case where the element isolating oxide film is formed using the two-layer structure formed of the silicon oxynitride film and silicon nitride film. Therefore, a so-called white ribbon phenomenon, i.e., formation of nitride on the substrate surface is effectively prevented, and thus the gate oxide film is formed uniformly. After forming the concavity at the surface of the semiconductor substrate, the concavity is selectively oxidized to form the element isolating oxide film, so that the upper flatness of the element isolating oxide film is improved as compared with the prior art. Also, owing to the concavity, the lower portion of the element isolating oxide film in the semiconductor substrate is located at a deeper position than that in the prior art, so that isolating properties are improved while maintaining the improved upper flatness of the element isolating oxide film. Since the silicon oxynitride film, i.e., intermediate layer relieves a stress which is generated when forming the element isolating oxide film, the thickness of the nitride film at the upper position can be increased. Consequently, the bird's beak length can be reduced. Since the silicon oxynitride film having anti-oxidation properties is used as the intermediate layer, it is possible to prevent a negative angle portion which causes a problem in the conventional polybuffer LOCOS method.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
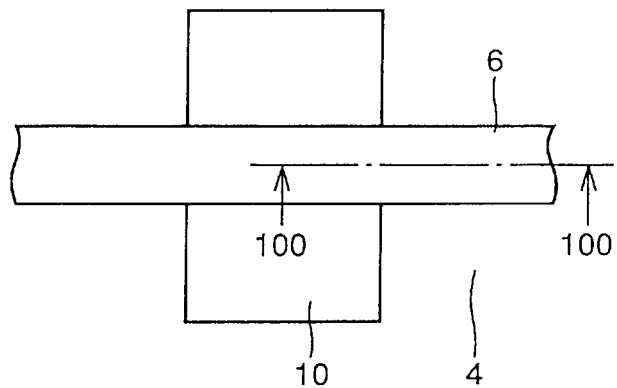
FIG. 1 is a plan showing a semiconductor device of an embodiment of the invention.
Figure 2:
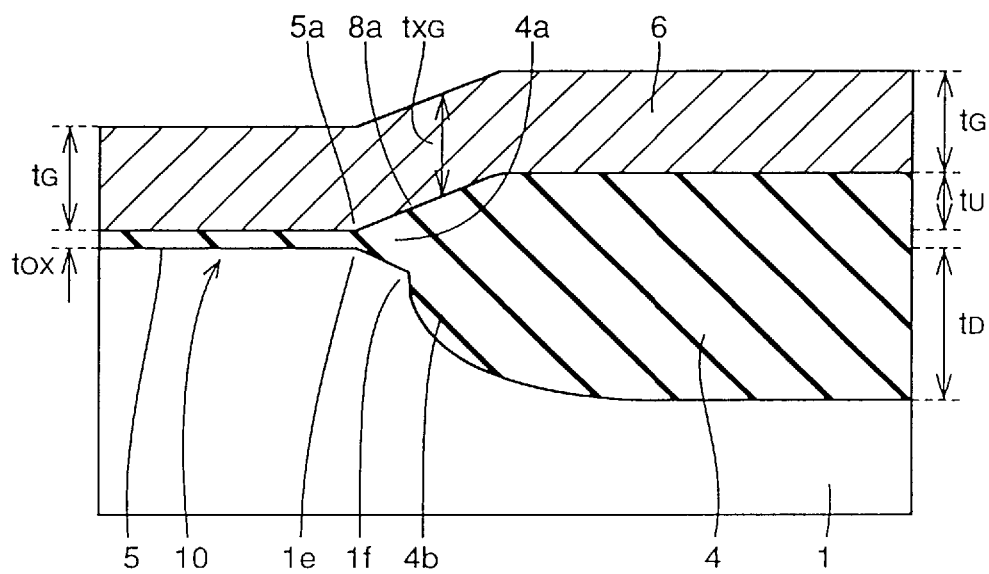
FIG. 2 is a cross section of the semiconductor device taken along line 100–100 in FIG. 1.

Embodiments of the invention will be described below with reference to the drawings. Referring to FIGS. 1 and 2, an embodiment of the invention includes field oxide film 4 formed on P-type silicon substrate 1 for element isolation. Gate oxide film 5 is formed continuously to the end of field oxide film 4. Polycrystalline silicon layer 6 forming a gate electrode extends over gate oxide film 5 and field oxide film 4.

Here, $t_U$ represents a length to the upper surface of the thickest portion of field oxide film 4 from a base which is the upper surface of gate oxide film 5, and $t_D$ represents a length from a lower surface of the thickest portion of field oxide film 4 from a base which is a lower surface of gate oxide film 5. $t_{OX}$ represents a film thickness of gate oxide film 5, and $t_G$ represents a film thickness of deposited polycrystalline silicon layer 6. θi represents an acute angle defined between the upper surface of gate oxide film 5 and a tangent at a given point (i.e., given point contained in an upper surface 8a of a bird's beak 4a) in an area between a point 5a at which film thickness $t_{OX}$ of gate oxide film 5 starts to increase and a point at which field oxide film 4 has the largest thickness. $t_{XG}$ represents a film thickness of polycrystalline silicon layer 6 located over bird's beak 4a of field oxide film 4.

Figure 3:
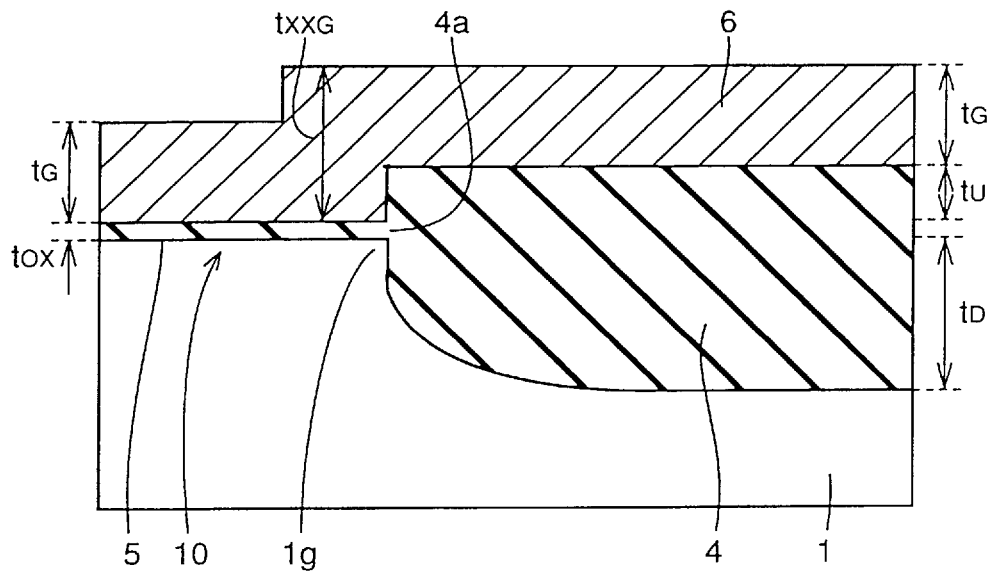
FIG. 3 is a cross section showing optimization of an upper flatness parameter $t_U$.

Referring to FIGS. 1 and 2, optimization of upper flatness parameters (θi and $t_U$) of field oxide film 4 will be described below. These parameters will be individually discussed below. FIG. 3 is a cross section for discussing $t_U$ between the above upper flatness parameters. Referring to FIG. 3, bird's beak 4a of field oxide film 4 in this structure extends substantially perpendicularly to the upper and lower surfaces of gate oxide film 5. The following formula (2) expresses a relationship among a film thickness $t_{XXG}$ of polycrystalline silicon layer 6 located at bird's beak 4a, film thickness $t_G$ of deposited polycrystalline silicon layer 6 and height $t_U$ from the upper surface of gate oxide film 5 to the upper surface of the thickest portion of field oxide film 4.

$$t_{XXG} = t_G + t_U \quad (2)$$

Assuming that $R_G$ represents an etching rate at the time of processing polycrystalline silicon layer 6 and that $R_{OX}$ represents an etching rate of gate oxide film 5 at the same time, a selection ratio R between polycrystalline silicon layer 6 and gate oxide film 5, which is found when processing polycrystalline silicon layer 6, is expressed by the following formula (3):

$$R = R_G / R_{OX} \quad (3)$$

According to the present etching technology, selection ratio R is approximately in a range from 10 to 30. According to this ratio, a time required by etching of polycrystalline silicon layer 6 for forming the gate electrode can be expressed by the following formula (4):

$$T = t_{XXG}(1+\alpha)/R_G \quad (4)$$

where $\alpha$ represents an overetching quantity in the processing of polycrystalline silicon layer 6, and is substantially set to satisfy a relationship of $0.1 \leq \alpha \leq 0.4$. As conditions required in the processing of polycrystalline silicon layer 6, gate oxide film 5 must not be removed completely within the etching time. If the gate oxide film were removed completely, the surface of P-type silicon substrate 1 would be exposed. If exposed, the surface of P-type silicon substrate 1 would be etched, so that the surface of P-type silicon substrate 1 would be hollowed. This impairs reliability of an MOSFET which will be formed at a later step. Conditions required for preventing complete removal of gate oxide film 5 within the etching time are expressed by the following formula (5):

$$(T - t_G/R_G) \cdot R_{OX} \leq t_{OX} \quad (5)$$

The following formula (6) is obtained by developing the formula (5) with the formulas (2), (3) and (4):

$$t_U \leq (R \cdot t_{OX}/t_G - \alpha) \cdot t_G/(1+\alpha) \quad (6)$$

Since R is substantially in a range from 10 to 30 and $t_{OX}/t_G$ is substantially in a range from 0.1 to 0.3, the following formula (7) is obtained:

$$R \cdot t_{OX}/t_G \cong 1 \quad (7)$$

By inserting the formula (7) into (6), the following formula (8) is obtained:

$$t_U \leq (1-\alpha) \cdot t_G/(1+\alpha) \quad (8)$$

The formula (8) can be rewritten into the following formula (9):

$$t_U \leq k \cdot t_G \quad (9)$$

From the formula (9), it can be seen that length $t_U$ from the upper surface of gate oxide film 5 to the upper surface of the thickest portion of field oxide film 4 is defined by the film thickness $t_G$ of deposited polycrystalline silicon layer 6. In accordance with change of $\alpha$, the value of k changes as shown in the following table 1.

TABLE 1

| $\alpha$ | 0.1 | 0.2 | 0.3 | 0.4 |
|---|---|---|---|---|
| k | 0.82 | 0.67 | 0.54 | 0.43 |

From Table 1, it is understood that $t_U$ which is one of parameters of upper flatness of field oxide film 4 must not be larger than 0.82 times the value of $t_G$.

Referring to FIG. 2, $\theta i$ which is one of the upper flatness parameters of field oxide film 5 will be discussed below. Film thickness $t_{XG}$ of polycrystalline silicon layer 6 located at bird's beak 4a of field oxide film 4 can be expressed with film thickness $t_G$ of deposited polycrystalline silicon layer 6 as well as angle $\theta i$ defined between the upper surface of gate oxide film 5 and a tangent at a given point at the upper surface of field oxide film 4, and specifically can be expressed by the following formula (10):

$$t_{XG} = t_G/\cos \theta i \quad (10)$$

A formula corresponding to the formula (4) is expressed by the following formula (11):

$$T = t_{XG}(1+\alpha)/R_G \quad (11)$$

By inserting this formula (11) into the formula (5) and developing the same, the following formula (12) is obtained:

$$(1+\alpha)/\cos \theta i - 1 \leq R \cdot t_{OX}/t_G \quad (12)$$

By inserting the formula (7) into the formula (12), the following formula (13) is obtained:

$$\cos \theta i \geq (1+\alpha)/2 \quad (13)$$

This formula (13) can be modified into the following formula (14):

$$0 < \theta i \leq \cos^{-1}\{(1+\alpha)/2\} \quad (14)$$

From the formula (14), it can be seen that $\theta i$ is defined by $\alpha$ which is the overetching quantity in the processing of polycrystalline silicon layer 6. The following table 2 expresses values of $\theta i$ corresponding to various values of $\alpha$.

TABLE 2

| $\alpha$ | 0.1 | 0.2 | 0.3 | 0.4 |
|---|---|---|---|---|
| $\theta i[°]$ | 56.6 | 53.1 | 49.5 | 45.6 |

Referring to Table 2, $\theta i$ must not be larger than 56.6° at any point on the upper surface of field oxide film 4 regardless of the film thickness of polycrystalline silicon layer 6.

From the above discussion, it is understood that $\theta i$ and $t_U$ must be within ranges expressed by the following formula (15):

$$\{\theta i, t_U | 0 \leq \theta i \leq 56.6°, 0 \leq t_U \leq 0.82 t_G\} \quad (15)$$

Figure 4:
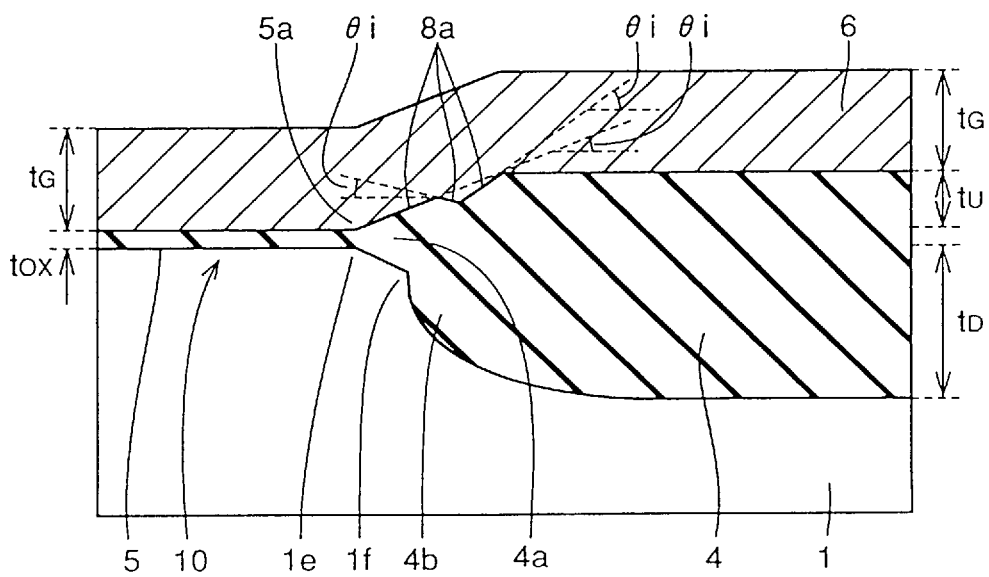
FIG. 4 is a cross section showing a semiconductor device having a structure satisfying required conditions of upper flatness parameters θi and $t_U$.

If the conditions defined by the formula (15) are satisfied, field oxide film 4 may have the upper surface structure shown in FIG. 4. In the structure shown in FIG. 4, upper surface 8a of bird's beak 4a of field oxide film 4 has a stepped section. Even this stepped section is employed, the conditions defined by the formula (15) are satisfied if angle θi defined between the upper surface of gate oxide film 5 and a tangent at a given point on upper surface 8a of bird's beak 4a is within a range from 0° to 56.6°. If the above conditions are satisfied, the gate oxide film 5 is not completely removed by overetching at the step of patterning polycrystalline silicon layer 6. Therefore, the surface of silicon substrate 1 is not shaved, and the reliability of device is not adversely affected.

Then, a structure of field oxide film 4 in which a reverse narrow channel effect does not occur will be discussed below. First, the reverse narrow natural effect will be described below. In general, a narrow channel effect, according to which a threshold voltage increases in accordance with reduction of a channel width, occurs in an MOS transistor. If the bird's beak length were simply reduced to form an end of the bird's beak perpendicular to the substrate surface, an inverted layer of the MOS transistor is liable to occur at the bird's beak in the channel width direction of the MOS transistor. This would reduce the threshold voltage. The threshold voltage would decrease to a higher extent in accordance with reduction of the channel width. This phenomenon is called the reverse narrow channel effect.

Figure 5:
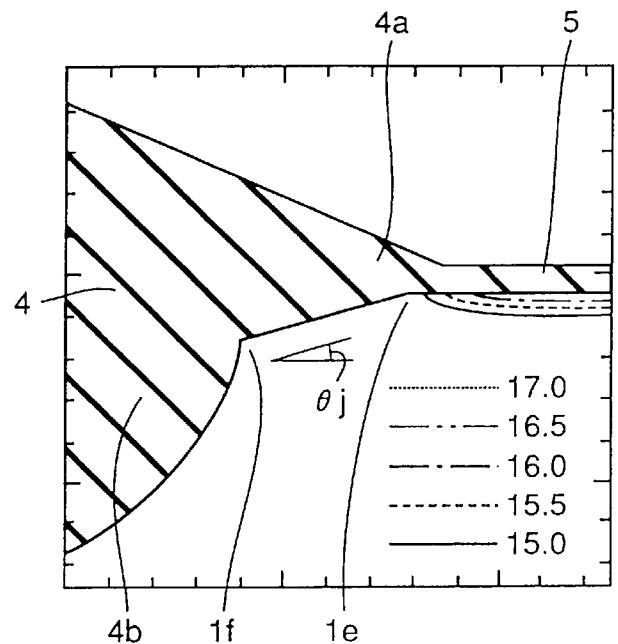
FIG. 5 systematically shows an electron concentration distribution immediately under a gate electrode in the case where 5.0 V is applied to a gate electrode in a structure including a field oxide film of the embodiment shown in FIG. 2.
Figure 6:
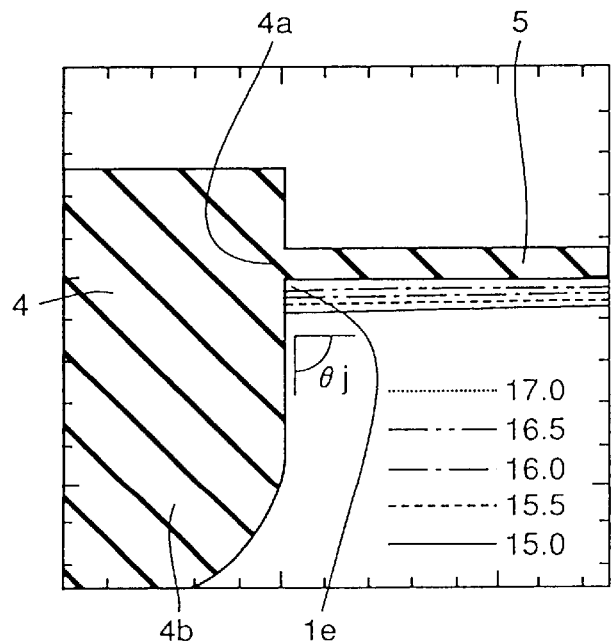
FIG. 6 schematically shows an electron concentration distribution immediately under a gate electrode in the case where 5.0 V is applied to a gate electrode in a structure including a field oxide film of which θj is 90°.

In this embodiment, field oxide film 5 employs the lower surface structure shown in FIG. 2 in order to prevent the reverse narrow channel effect. More specifically, a discontinuous point 1f exists between the lower surface of bird's beak 4a and the lower surface of other portion 4b. The following simulation was performed with various values of angle θj between the lower surface of bird's beak 4a and the lower surface of gate oxide film 5. FIGS. 5 and 6 show distributions of the electron concentration immediately under the gate electrode to which 5.0 V was applied. Numbers in these figures represent the concentration of induced electrons, and, for example, 15.5 means $1.0E15.5 cm^{-3}$. FIG. 5 shows a result of simulation performed for field oxide film 4 having a configuration similar to that of the embodiment shown in FIG. 2. FIG. 6 shows a result of simulation for a configuration in which θj is 0° or 90°.

It can be seen that, according to the structure of field oxide film 4 of the embodiment shown in FIG. 5, the electron concentration is low and thus formation of an inverted layer is suppressed at an edge 1e of field oxide film 4 in the channel width direction of the MOS transistor as compared with the structure shown in FIG. 6. From this, it can be understood that the LOCOS structure of this embodiment can suppress reduction of the threshold voltage. As a result, the reverse narrow channel effect described above can be prevented. According to the structure in FIG. 6 not provided with a bird's beak, the electron concentration is high and thus the inverted layer is liable to be formed at edge 1e of field oxide film 4. As a result, the threshold voltage is liable to decrease. This tendency becomes remarkable as the channel width decreases, so that the reverse narrow channel effect is liable to occur.

Thus, the structure in FIG. 6 not provided with bird's beak 4a is inappropriate, and it is important to reduce the bird's beak length and thereby achieve optimization as shown in FIG. 5.

Figure 7:
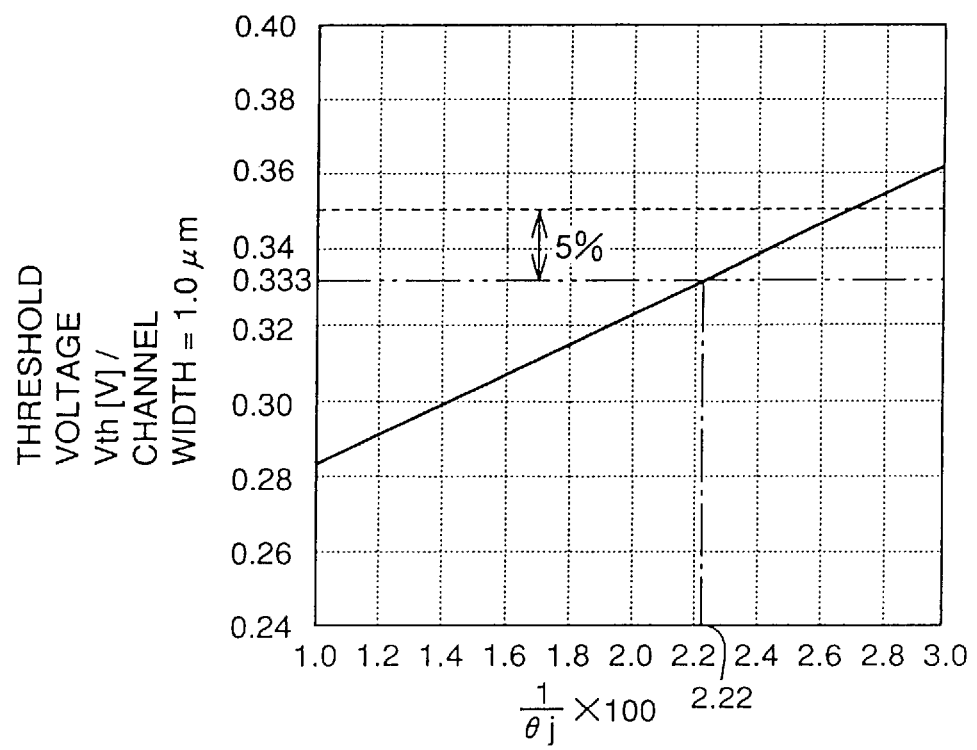
FIG. 7 shows a relationship between θj and a threshold voltage $V_{th}$.

Meanwhile, it is desirable that acute angle θj between bird's beak 4a and the lower surface of gate oxide film 5 is within a range defined by $0<\theta j \leq 45°$. The reason for this will be described below with reference to FIG. 7. In FIG. 7, abscissa gives 100/θj, and ordinate gives threshold voltage $V_{th}$ with channel width W of 1.0 μm. The evaluated basic device has threshold voltage $V_{th}$ of 0.35 V. If reduction of $V_{th}$ by 5% is allowed, it is desirable that θj does not exceed 45°. More specifically, if $V_{th}$ of 0.35 V is reduced by 5%, $V_{th}$ is nearly 0.333 V. In this case, 100/θj is 2.22. When calculated with these values, θj is nearly 45°. Accordingly, it is desirable to set θj within a range defined by $0<\theta j \leq 45°$ in order to set variation of the threshold voltage within about 5%.

Description will now be given on a process of manufacturing the field oxide film in the semiconductor device of the embodiment shown in FIGS. 1 and 2.

Figure 8:
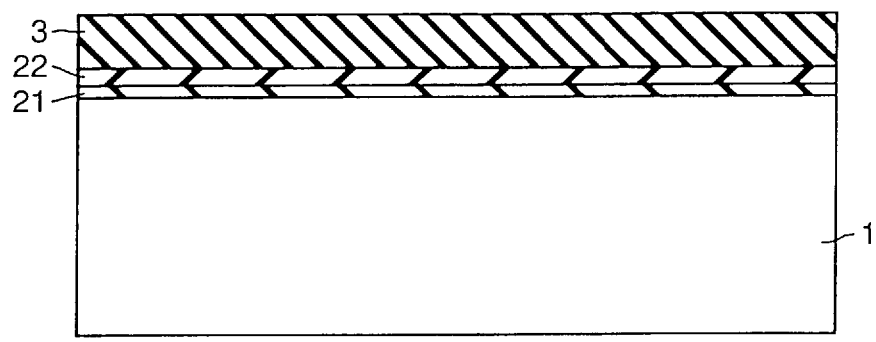
FIGS. 8 to 11 are cross sections showing a manufacturing process of a structure of the embodiment of the invention shown in FIG. 2.

Referring first to FIG. 8, the surface of P-type silicon substrate 1 is thermally oxidized or treated with hydrogen peroxide ($H_2O_2$) to form a silicon oxide film ($SiO_2$ film) 21 having a thickness from about 10 to about 100 Å. On silicon oxide film 21, a silicon oxynitride film ($SiO_XN_Y$ film) 22 having a thickness, which is two to eight times as large as that of silicon oxide film 21, is formed by the low pressure CVD method. On the silicon oxynitride film 22, a silicon nitride film ($Si_3N_4$ film) 3 having a film thickness, which is two to eight times as large as that of silicon oxynitride film 22, is formed by the low pressure CVD method. In this manner, a mask having a three-layer structure is formed.

Figure 9:
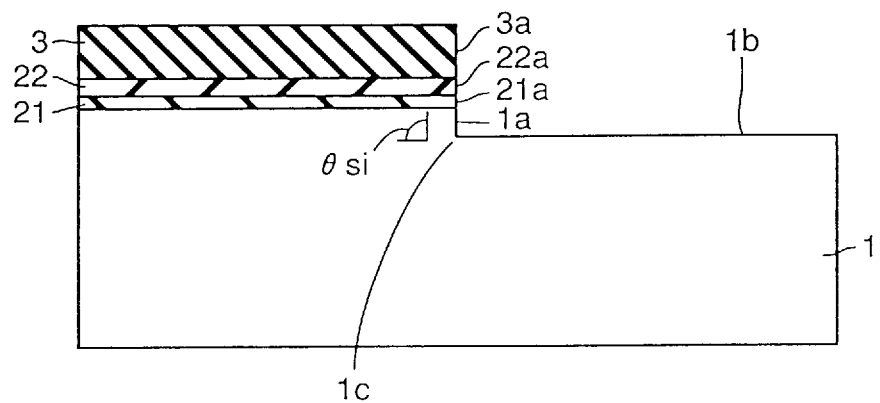

A photoresist (not shown) is selectively formed at a predetermined region on silicon nitride film 3, and anisotropic etching is performed using this photoresist as a mask. Thereby, silicon nitride film 3, silicon oxynitride film 22 and silicon oxide film 21 are patterned as shown in FIG. 9. Silicon nitride film 3, silicon oxynitride film 22 and silicon oxide film 21 thus patterned have end surfaces 3a, 22a and 21a, respectively. Subsequent to this patterning, the surface of substrate 1 is selectively etched and thereby removed by a predetermined thickness, so that a new substrate surface 1b is formed. A new connection 1c is formed between end surface 1a and new substrate surface 1b. Thereafter, photoresist is removed. The film thickness (i.e., recess quantity) by which silicon substrate 1 is removed is selected in accordance with the film thickness of field oxide film 4 to be formed later and the film thickness of the gate electrode layer, and specifically is selected to be within a range defined by the formula (15).

Figure 10:
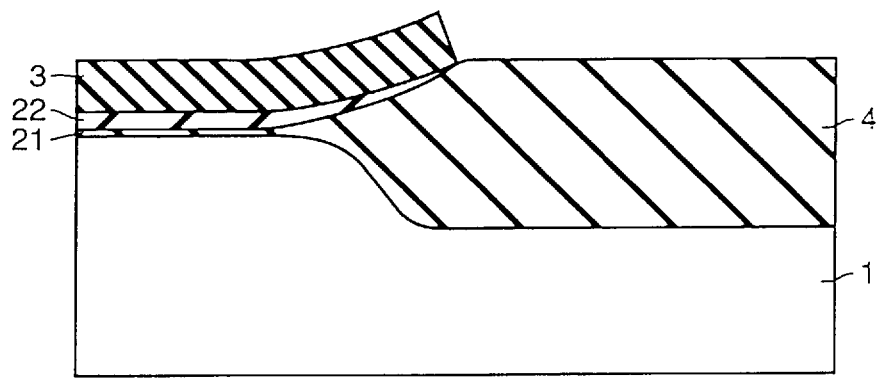
Figure 11:
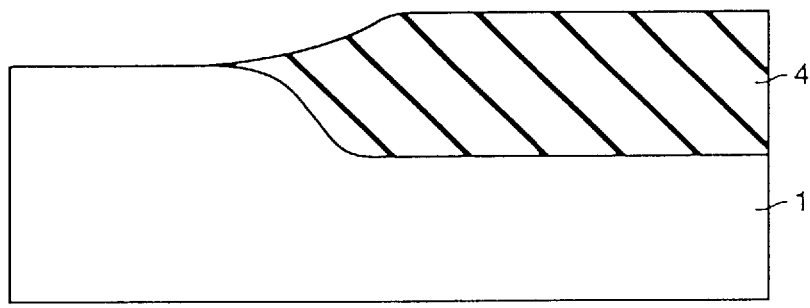

Then, using silicon nitride film 3 as a mask, thermal oxidation is effected on end surfaces 22a, 21a and 1a as well as substrate surface 1b and connection 1c. Thereby, field oxide film 4 is formed as shown in FIG. 10. Thereafter, silicon nitride film 3 is removed by wet etching with phosphoric acid ($H_3PO_4$). By wet etching with HF solution, silicon oxynitride film 22 and silicon oxide film 21 are continuously removed. Thereby, the structure shown in FIG. 11 is formed. Thereafter, the intended semiconductor device is completed through the same steps as those generally employed for a conventional semiconductor device such as an MOSLSI.

Figure 12:
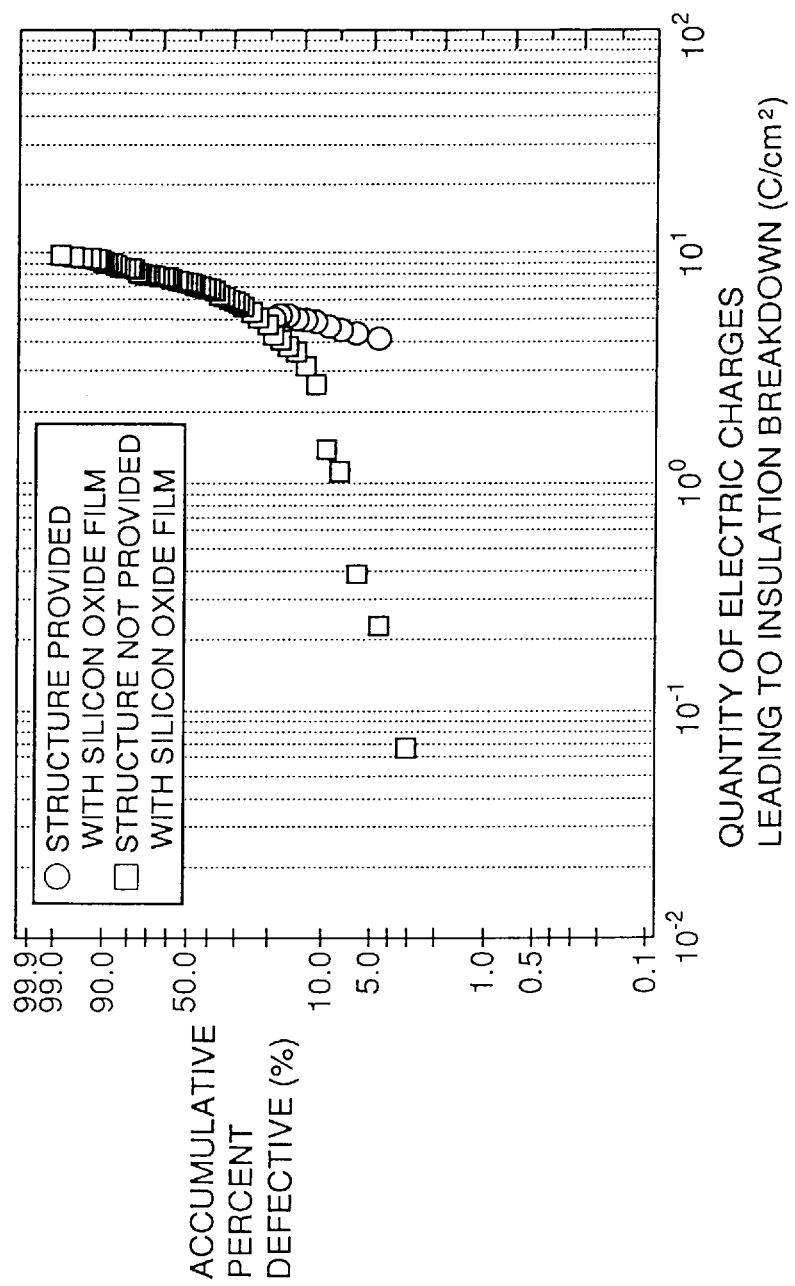
FIG. 12 shows a relationship between a quantity of electric charges leading to insulation breakdown and an accumulative percent defective in the cases where a three-layer structure shown in FIG. 8 includes a silicon oxide film and it does not include a silicon oxide film.
Figure 42:
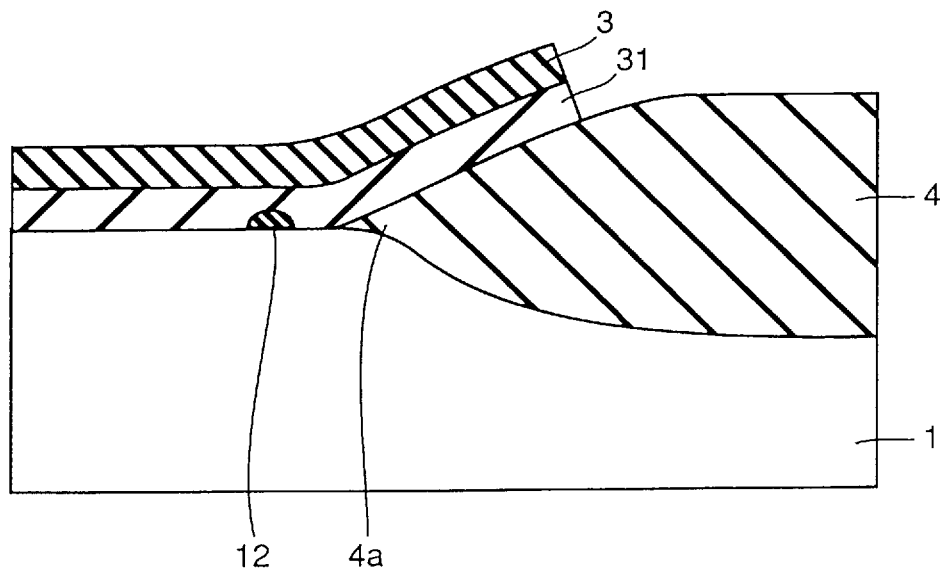
FIG. 42 is a cross section showing a process of manufacturing a field oxide film using films of a conventional two-layer structure.
Figure 43:
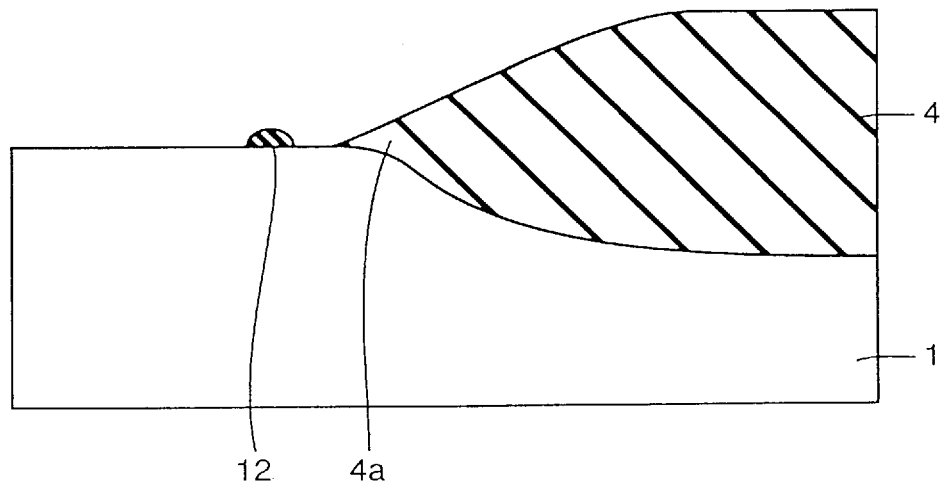
FIG. 43 is a cross section showing a disadvantage caused by formation of the field oxide film using the film of the conventional two-layer structure.

Description will now be given on a merit of employment of the three-layer structure including silicon nitride film 3, silicon oxynitride film 22 and silicon oxide film 21. After the step shown in FIG. 11, the gate oxide film (having film thickness $t_{OX}$ of 12 nm) used in the MOSFET was evaluated by a constant current stress method (CCS evaluation). The result is shown in FIG. 12. Referring to FIG. 12, this evaluation was performed at a room temperature with a stress of 0.2 A/cm². As shown in FIG. 12, data represents comparison between the structure provided with silicon oxide film 21 and the structure not provided with the same. The ordinate gives an accumulative percent defective, and the abscissa gives a quantity of electric charges per area leading to insulation breakdown. As is apparent from the data, the reliability of the gate oxide film in the structure provided with silicon oxide film 21 is higher than that in the structure not provided with the same. From this, the structure including silicon nitride film 3, silicon oxynitride film 22 and silicon oxide film 21 can improve the reliability of the gate oxide film to be formed later as compared with the two-layer structure including silicon nitride film 3 and silicon oxynitride film 22. This is due to the fact that white ribbon 12 shown in FIGS. 42 and 43 is formed in the two-layer structure including the silicon nitride film and silicon oxynitride film.

Although the three-layer structure can improve the reliability of gate oxide film, it may cause a problem in connection with a composition (refractivity) of the silicon oxynitride film (SiON film). If the composition of SiON film 22 were close to the composition of SiN film 3, white ribbon 12 shown in FIG. 43 would be liable to be formed. Meanwhile, if the composition of SiON film 22 were close to the composition of $SiO_2$ film 22, anti-oxidation properties would be impaired, and thus the bird's beak would extend to a larger extent. Therefore, it is desirable that the composition of SiON film 22 is selected to set its refractivity n within a range from 1.47 to 1.70.

It is also desirable to minimize the film thickness of silicon oxide film 21 in FIG. 8 in view of reduction of the bird's beak length. For example, in the semiconductor devices of which design rule is at a 0.5 $\mu$m level, the bird's beak length must be lower than about 0.15 $\mu$m. In this case, the film thickness of silicon oxide film 21 must be substantially within a range from 10 to 100 Å. In order to achieve the above bird's beak length, the film thickness of silicon oxynitride film 22 must be two to eight times as large as that of silicon oxide film 21, and the film thickness of silicon nitride film 3 must be two to eight times as large as that of silicon oxynitride film 22.

Figure 13:
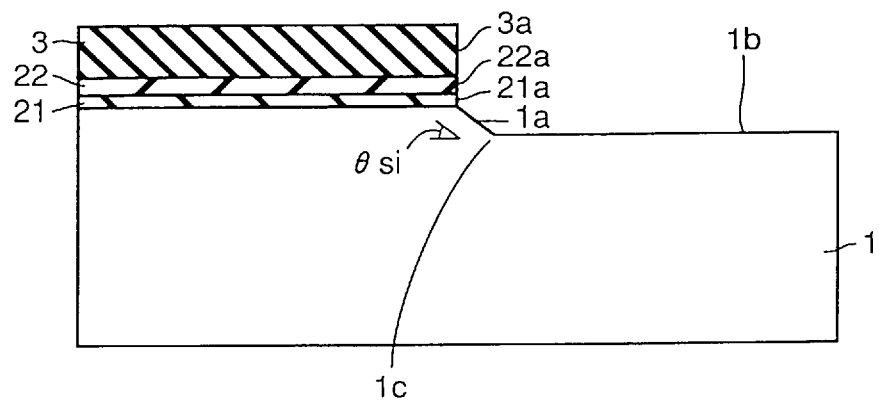
FIG. 13 is a cross section showing an allowable range of θsi at the step shown in FIG. 9.
Figure 14:
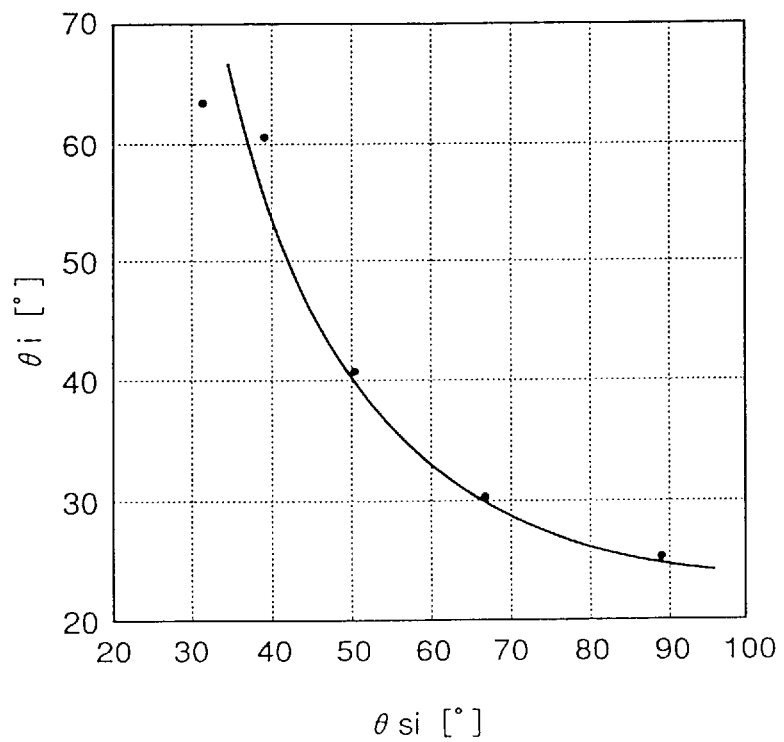
FIG. 14 shows a relationship between θsi and θi.

Discussion will be given on an angle $\theta$si defined between substrate surfaces 1a and 1b at the step shown in FIG. 9. A required minimum value of $\theta$si will be first discussed with reference to FIGS. 13 and 14. FIG. 14 shows a relationship between $\theta$si and $\theta$i. In order to satisfy the condition that $\theta$i in the formula (15) is not larger than 56.6°, $\theta$si must be 40° or more.

Figure 15:
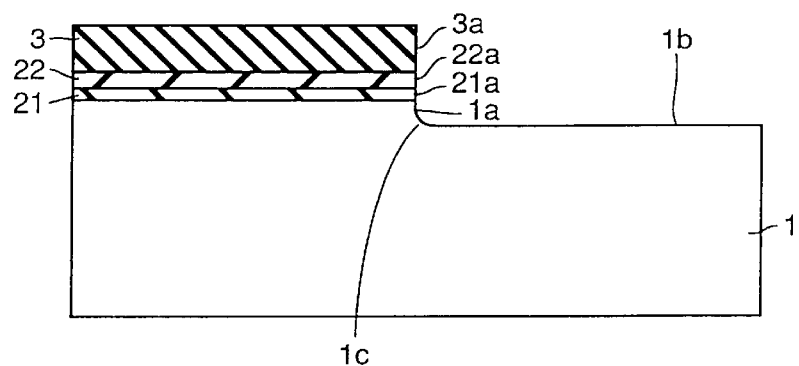
FIG. 15 is a cross section showing a preferred example of a configuration of a connection 1c at the step shown in FIG. 9.
Figure 16:
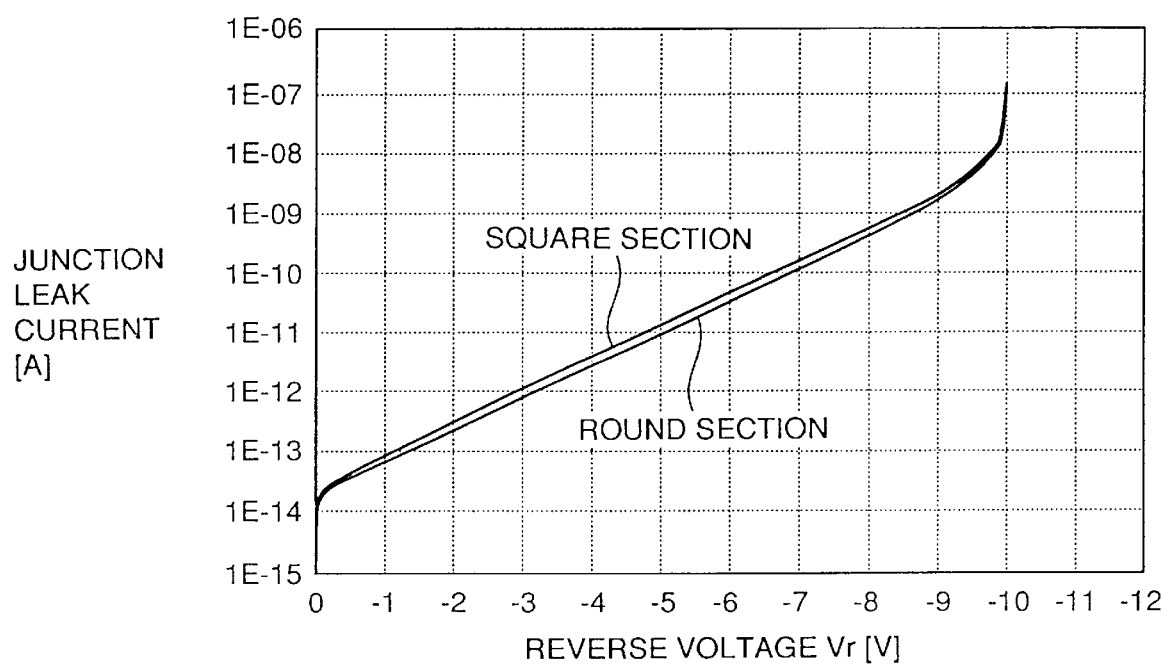
FIG. 16 shows a relationship between a reverse voltage and a junction leak current in the cases where a connection is square and it is circular.

At the step shown in FIG. 9, it is desirable that connection 1c between substrate surfaces 1a and 1b has a round section or shape (not having an angular portion) as shown in FIG. 15. FIG. 16 shows a relationship between a reverse voltage and a junction leak current in the cases where connection 1c has a square section and where it has a round section. Referring to FIG. 16, it can be seen that the round section not having a square portion causes a less junction leak current. Therefore, it is desirable that connection 1c has the round section as shown in FIG. 15. The structure of connection 1c shown in FIGS. 13 and 15 can be easily formed by appropriately adjusting the kind and flow rate of the etching gas as well as a degree of vacuum.

Figure 17:
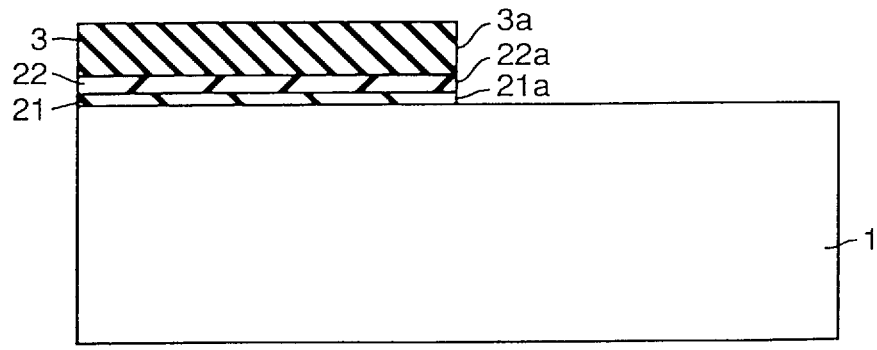
FIGS. 17 to 19 are cross sections showing first to third examples of another manufacturing process for forming the structure of the embodiment of the invention shown in FIG. 2, respectively.

Description will now be given on another process of manufacturing the semiconductor device of the embodiment shown in FIG. 2. Referring to FIG. 17, the surface of silicon substrate 1 is exposed but silicon substrate 1 is not etched in this method. By appropriately selecting the film thicknesses of field oxide film 4 and the gate electrode to be formed later, the structure satisfying the formula (15) can be formed even if the surface of silicon substrate 1 is not etched by a predetermined thickness.

Figure 18:
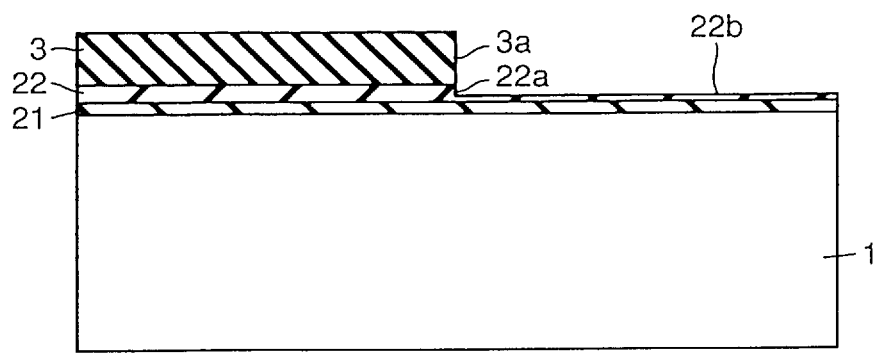

FIG. 18 is a cross section showing still another process of manufacturing the semiconductor device of the embodiment shown in FIG. 2. In this process, SiON film 22 is partially left to form a remaining portion 22. Therefore, selective oxidation is performed to form field oxide film 4. Also this manufacturing process can form the structure satisfying the formula (15) by appropriately selecting the thicknesses of field oxide film 4 and the gate electrode.

Figure 19:
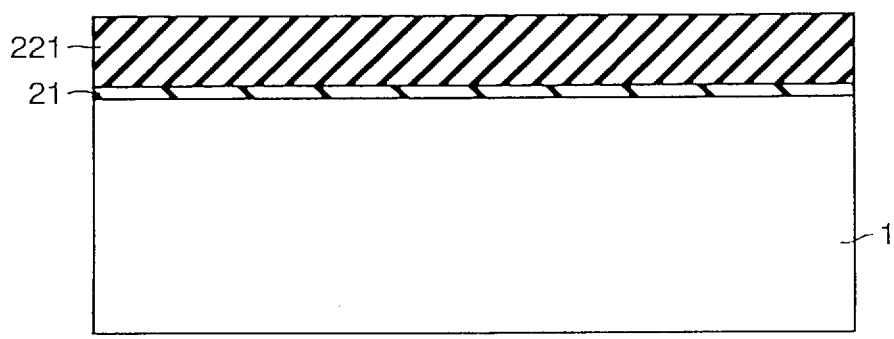

Even in a method shown in FIG. 19, the two-layer structure including silicon oxide film 21 and $SiO_XN_Y$ film 22 can achieve an effect similar that of the three-layer structure shown in FIG. 8, if $SiO_XN_Y$ film 221 has such a composition that x decreases and y increases as a position moves upward. Thus, the LOCOS structure satisfying the formula (15) and shown in FIG. 2 can be formed.

Figure 20:
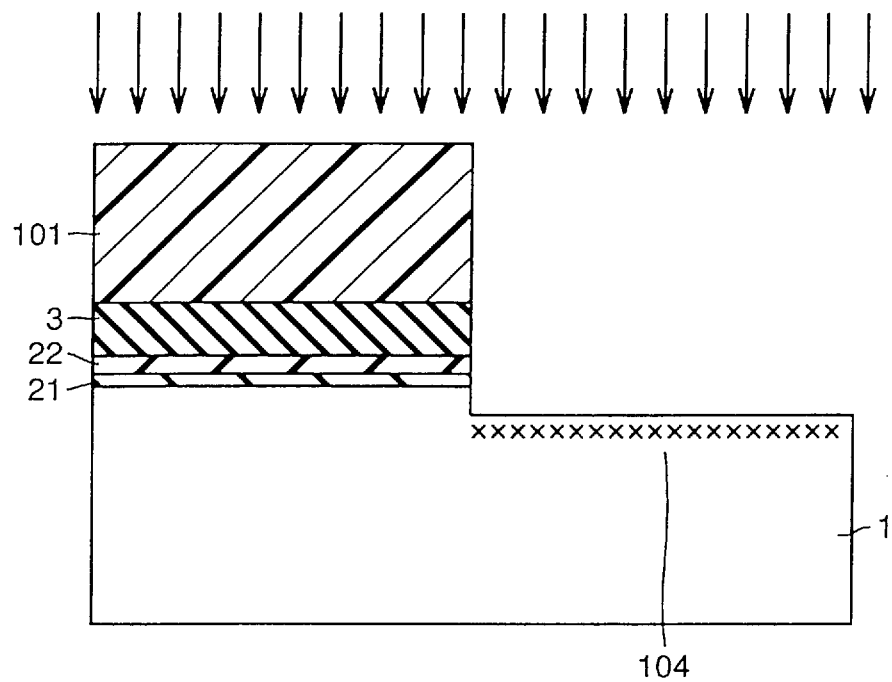
FIGS. 20 to 23 are cross sections showing first to fourth examples of a manufacturing process for forming a channel stopper layer in an LOCOS structure of the invention, respectively.
Figure 21:
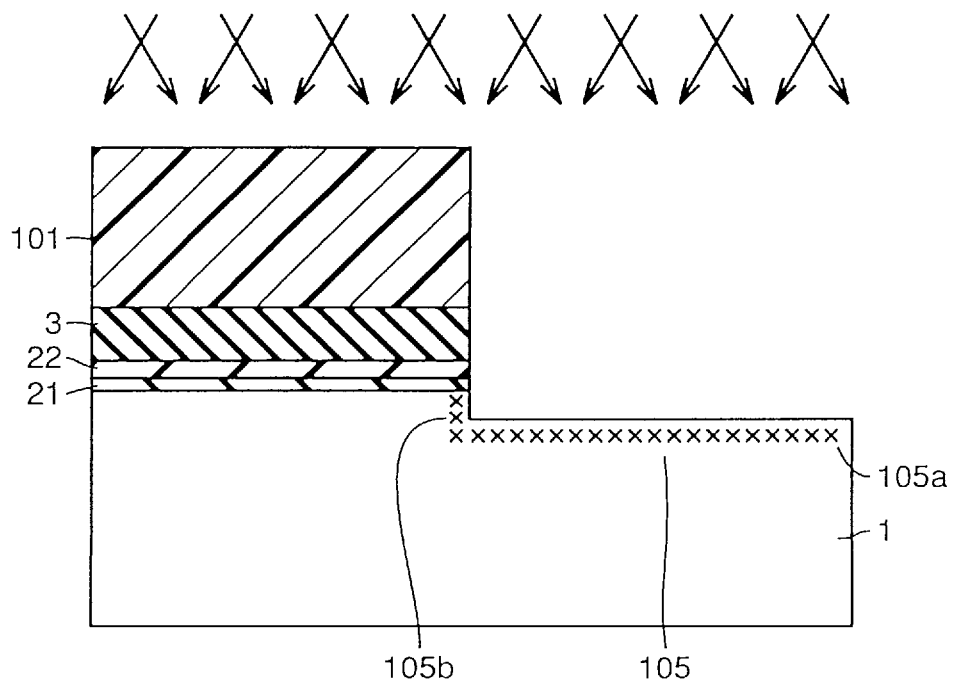

The LOCOS structure of the embodiment of the invention shown in FIG. 2 may be provided with a channel stopper layer, e.g., of $p^+$-type located immediately under field oxide film 4 for improving the electric isolation properties. The channel stopper layer may be formed by either of two processes, i.e., before or after formation of field oxide film 4. If the channel stopper layer is to be formed before formation of field oxide film 4, ions, e.g., of boron (B) are implanted into the surface of silicon substrate 1 partially covered with a resist 101 as shown in FIG. 20 at a step between the processes shown in FIGS. 8 and 9. In the process shown in FIG. 20, boron is ion-implanted vertically downward, so that an implantation profile 104 is formed. Boron may be implanted into silicon substrate 1 by an oblique rotary ion implanting method as shown in FIG. 21. In this case, implantation profiles 105 (105a and 105b) are obtained as shown in FIG. 21.

Figure 22:
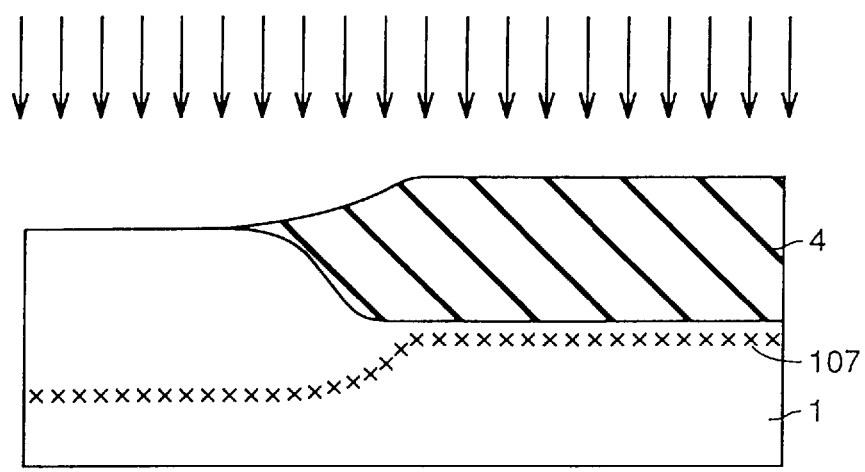
Figure 23:
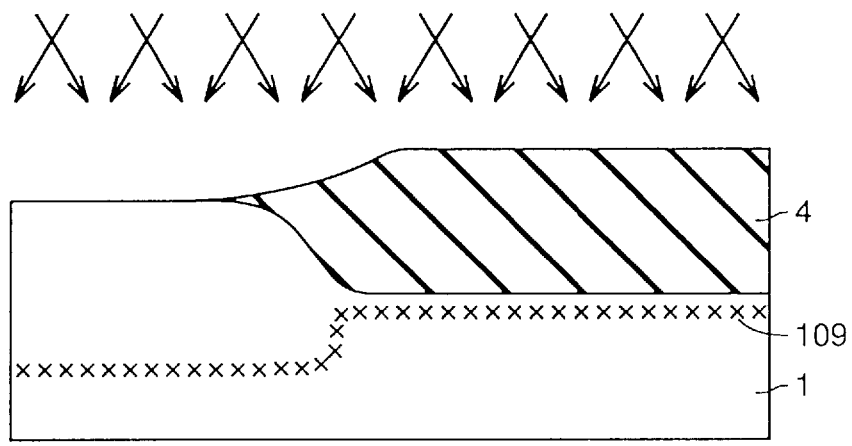
Figure 24:
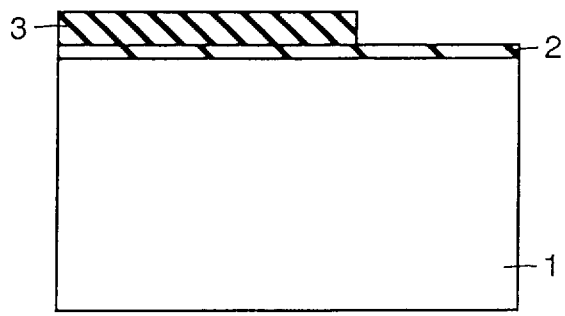
FIGS. 24 to 27 are cross sections showing a conventional process of manufacturing a semiconductor device.
Figure 25:
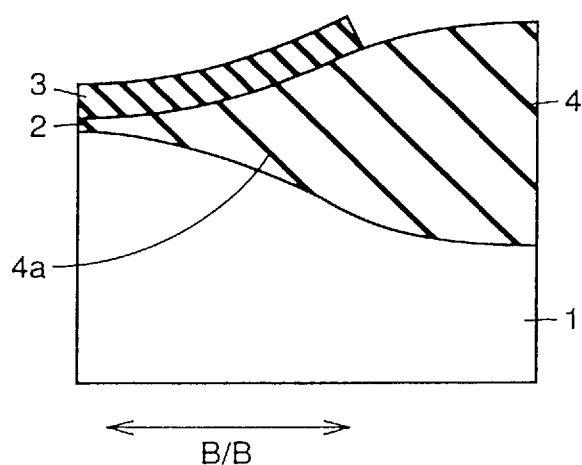
Figure 26:
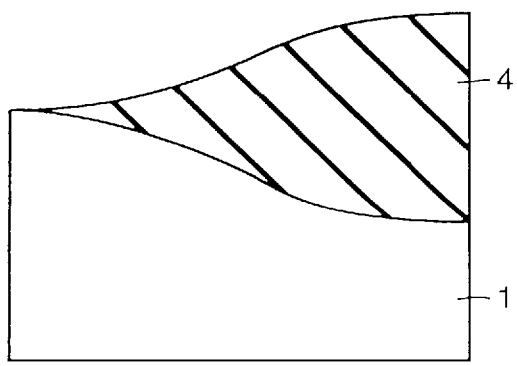
Figure 27:
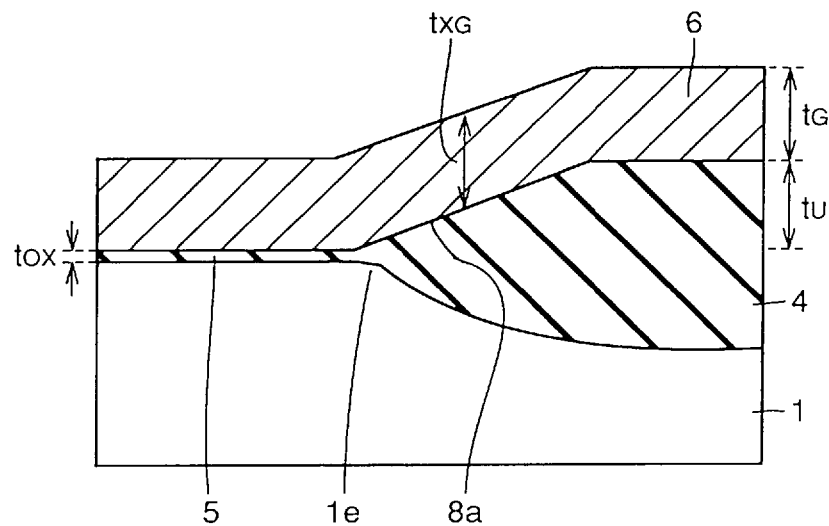
Figure 28:
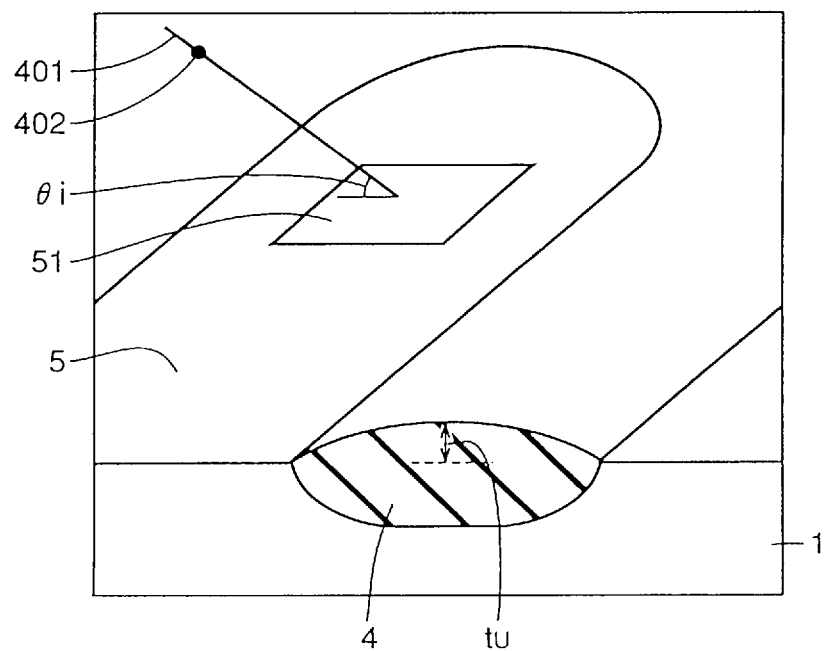
FIG. 28 is a perspective view of a conventional LOCOS structure.
Figure 29:
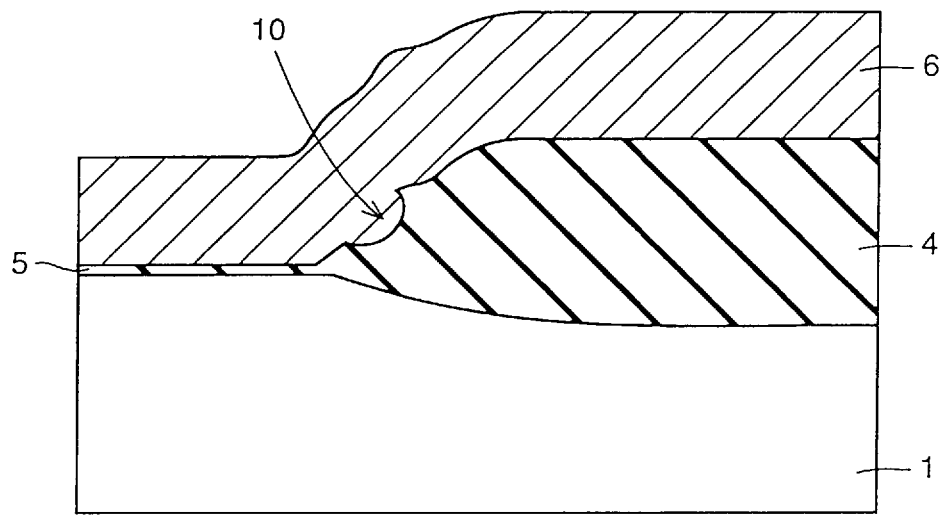
FIG. 29 is a cross section showing a conventional LOCOS structure having a negative angle portion.
Figure 30:
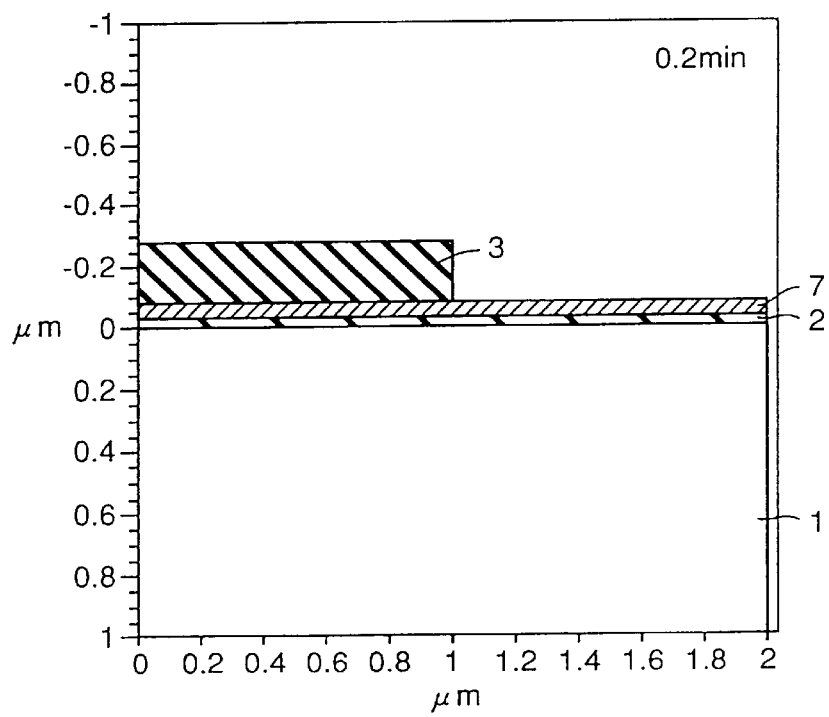
FIGS. 30 to 41 are cross sections showing a simulated process of forming a field oxide film by a conventional polybuffer LOCOS method.
Figure 31:
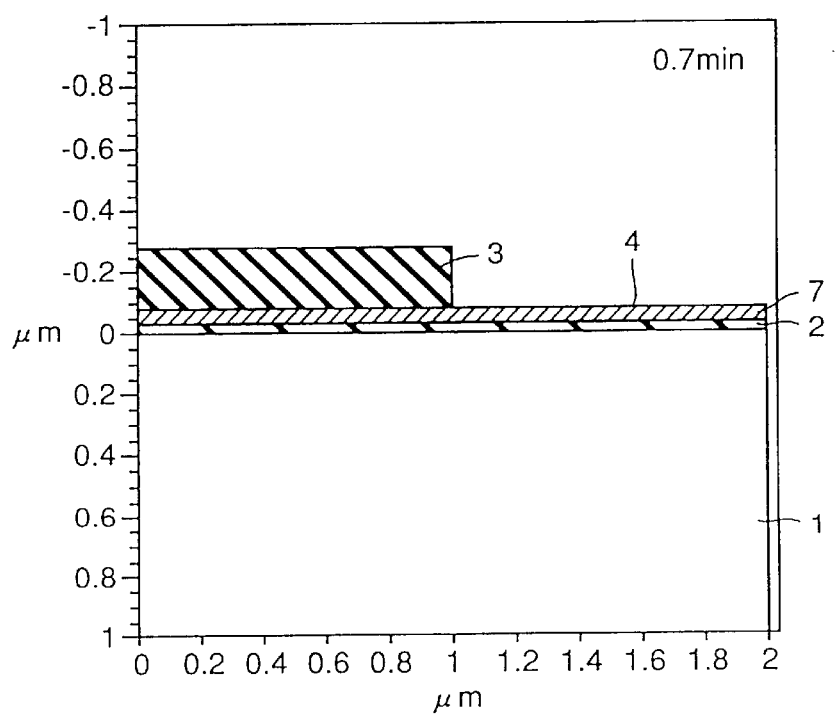
Figure 32:
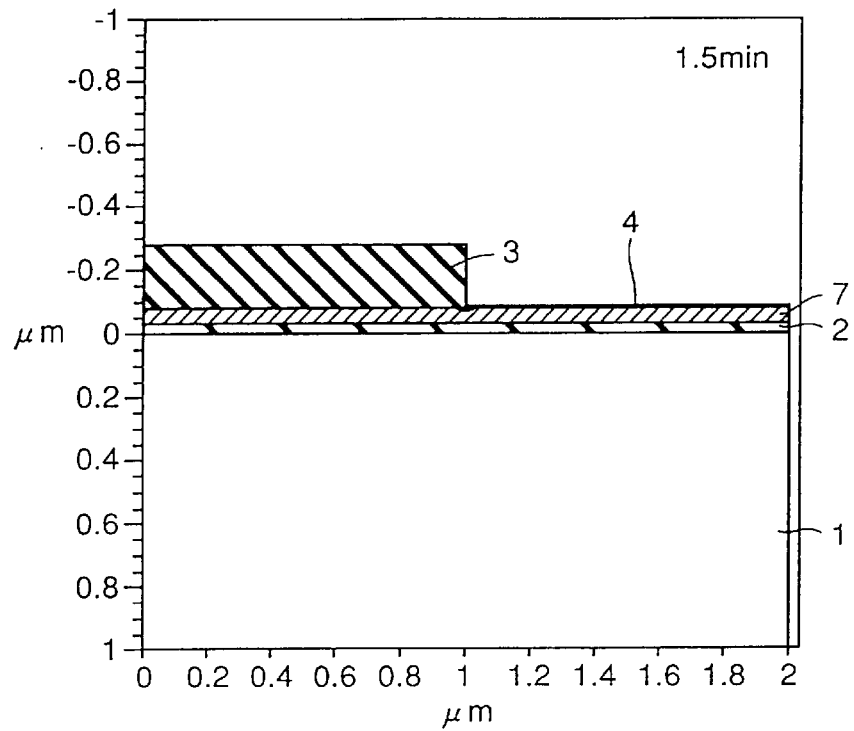
Figure 33:
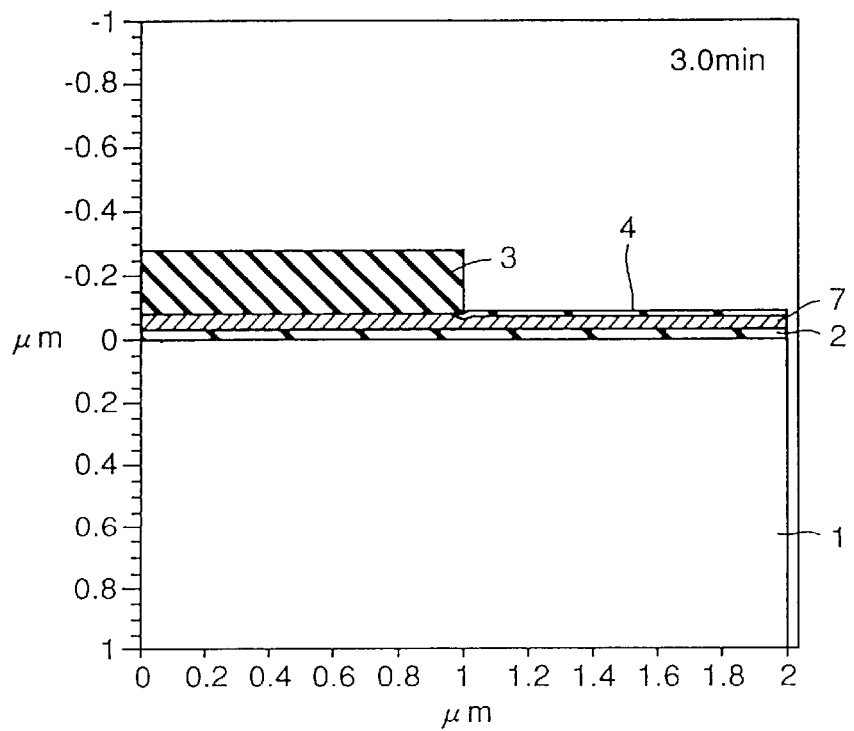
Figure 34:
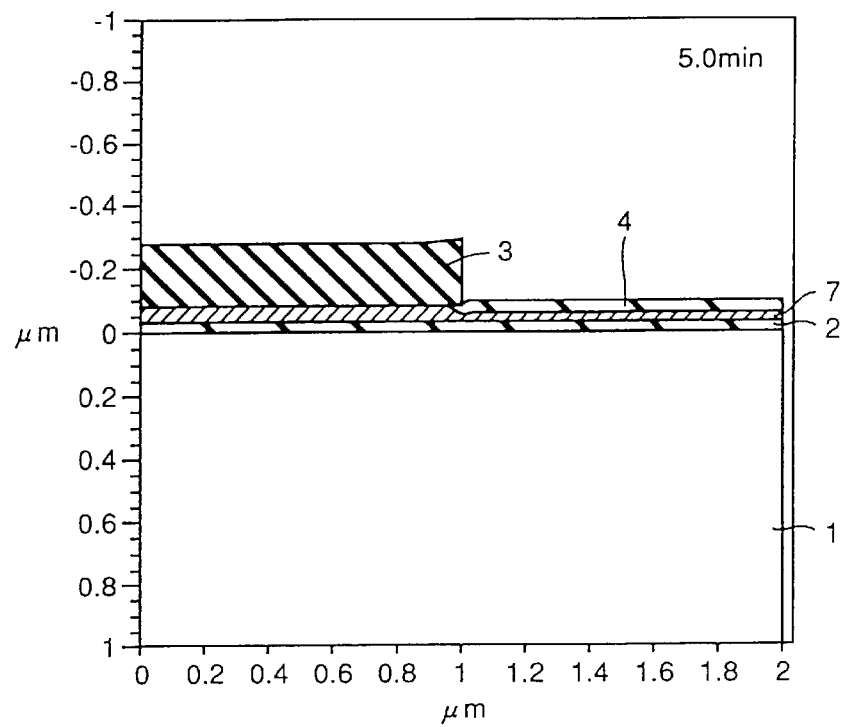
Figure 35:
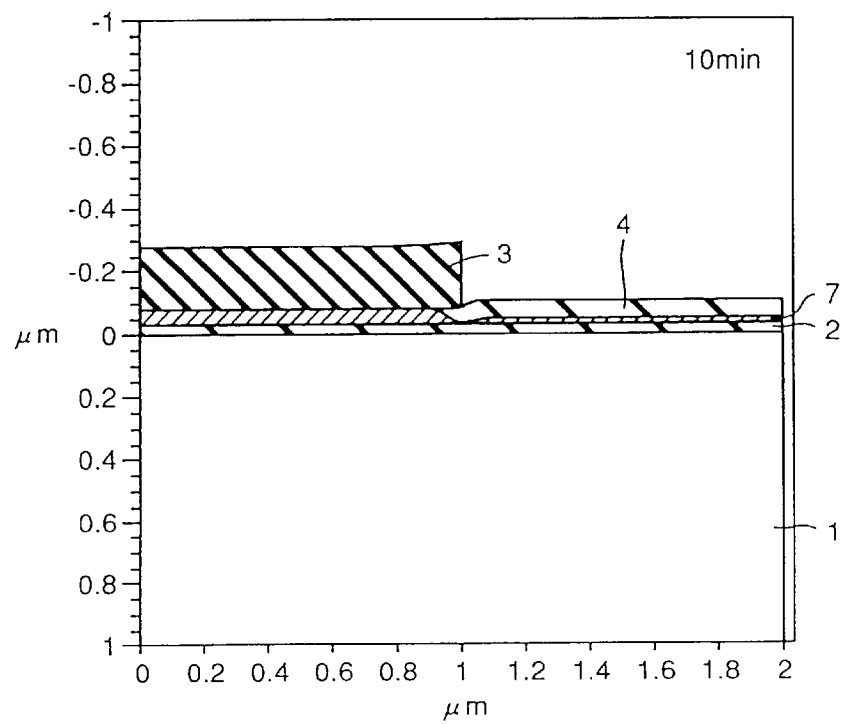
Figure 36:
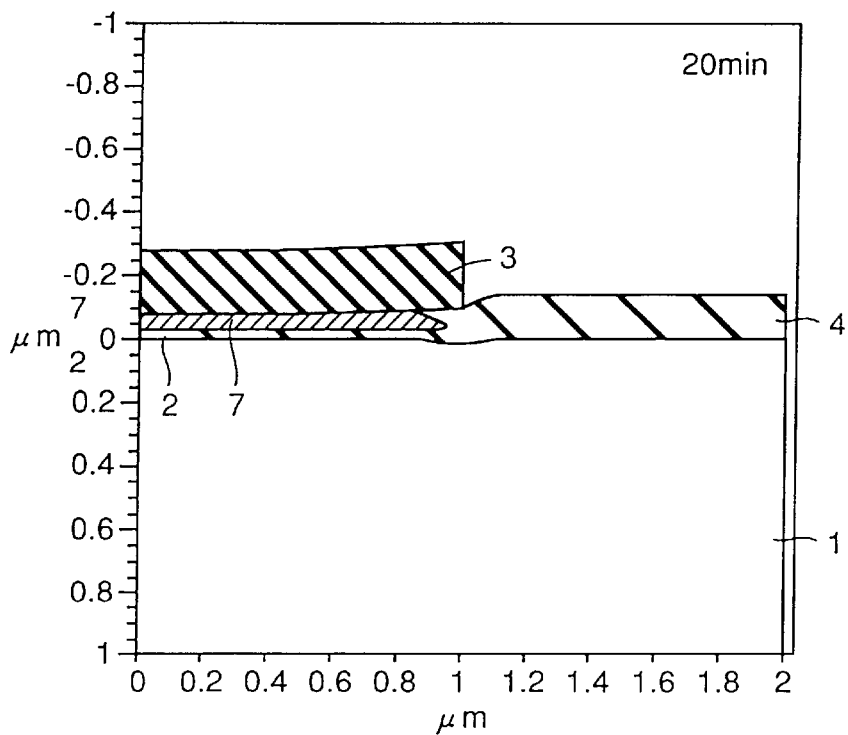
Figure 37:
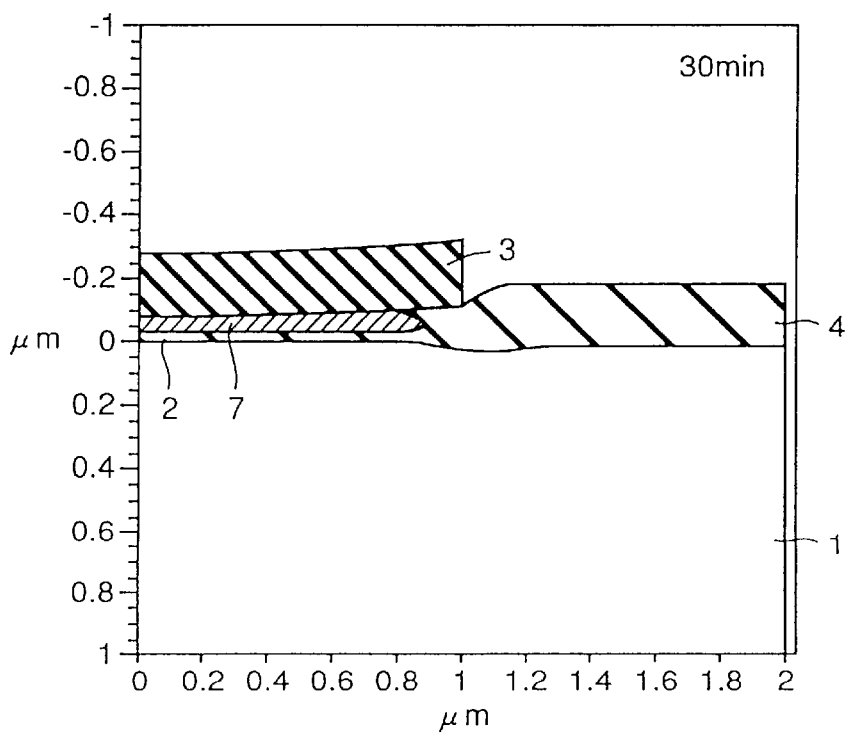
Figure 38:
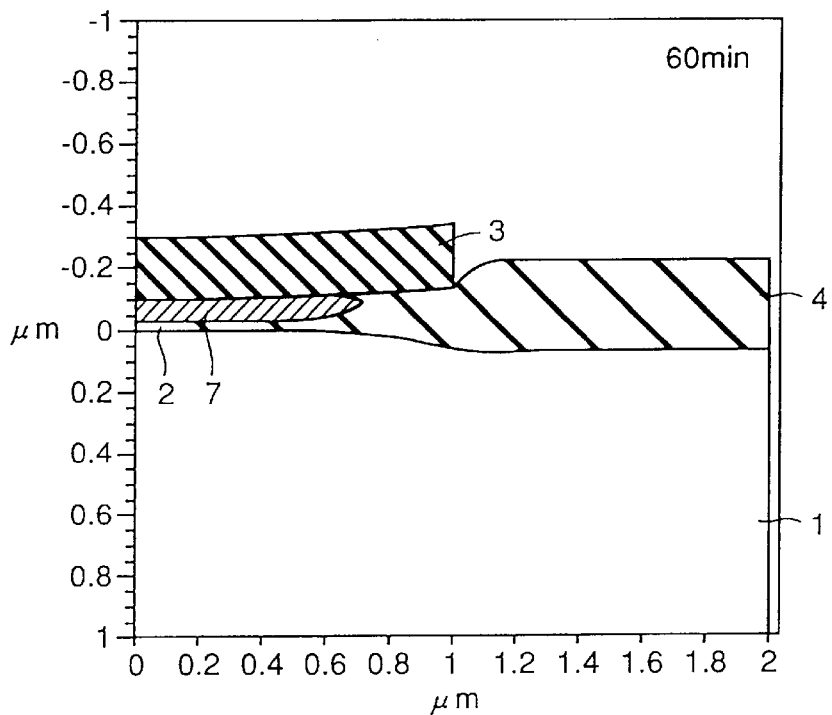
Figure 39:
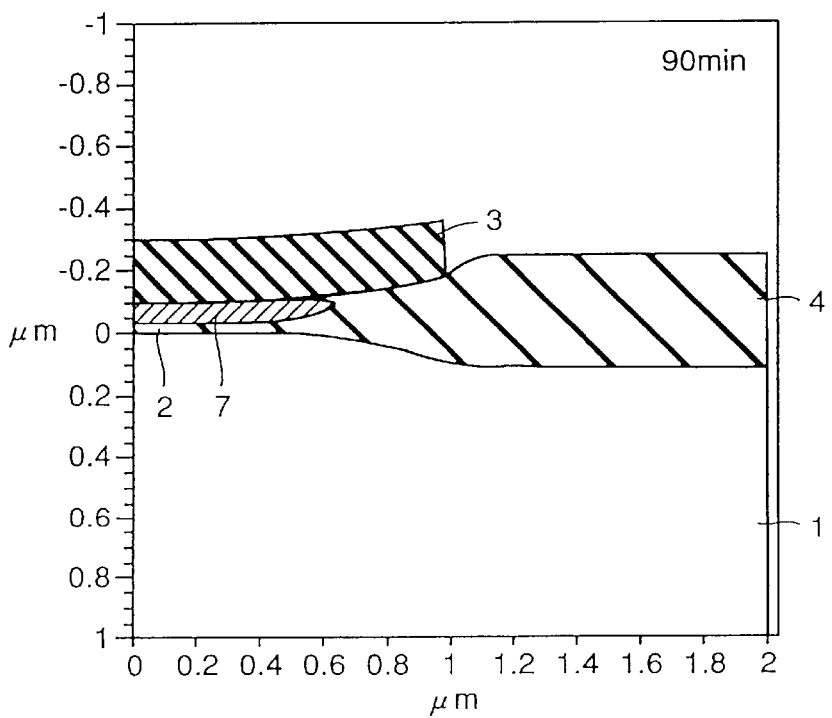
Figure 40:
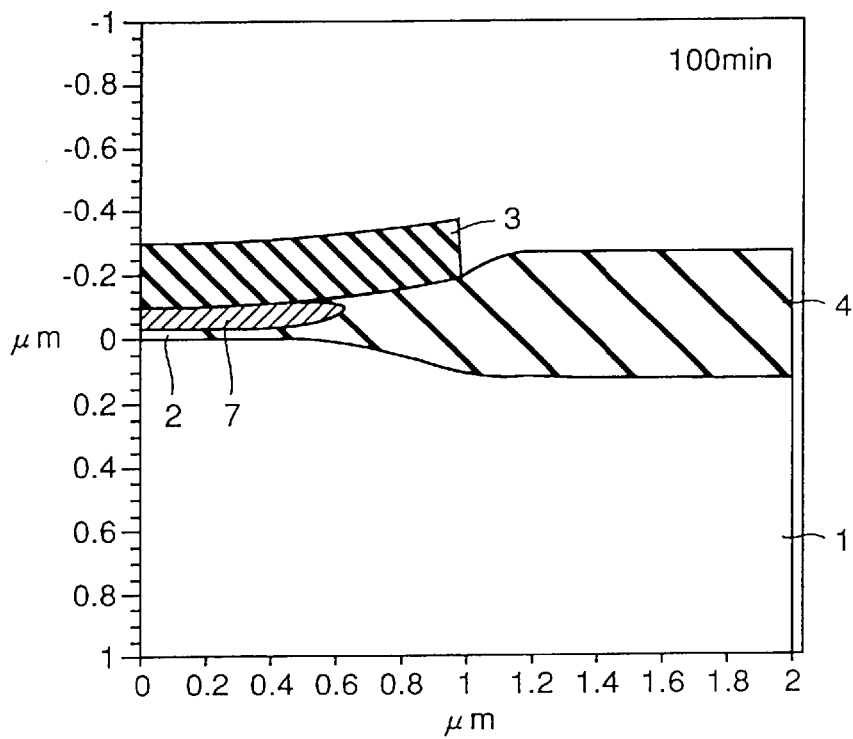
Figure 41:
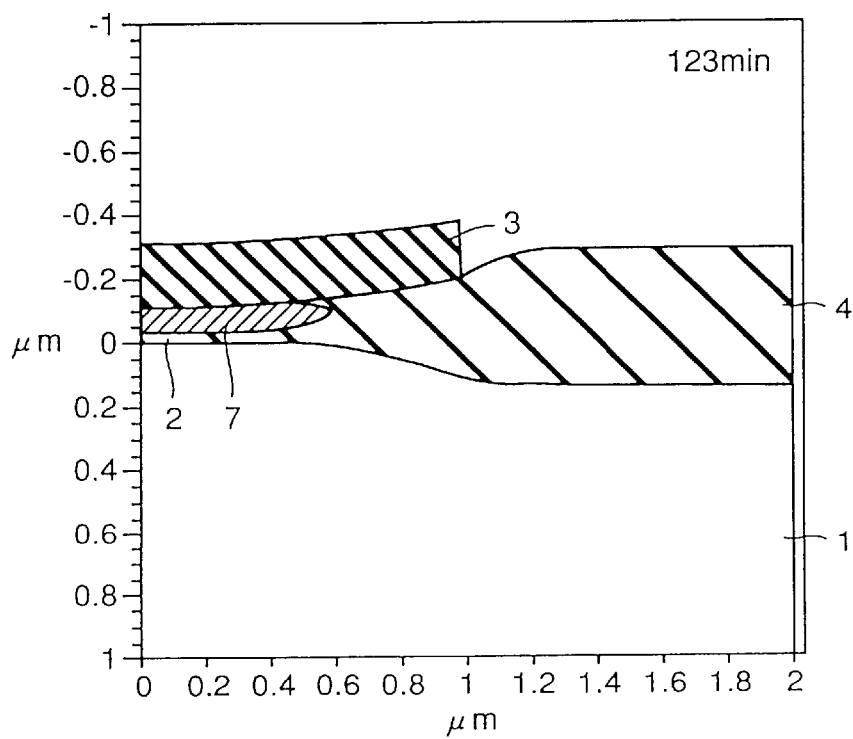

If the channel stopper layer is to be formed after forming field oxide film 4, ions of, e.g., boron are implanted vertically downward through field oxide film 4 as shown in FIG. 22 after the step shown in FIG. 11. In this case, an impurity profile 107 shown in FIG. 20 is obtained. The channel stopper layer may be formed by the oblique rotary ion implanting method as shown in FIG. 23, in which case an impurity profile 109 shown in FIG. 23 is obtained.

According to the semiconductor device of the above aspect, as described above, the upper flatness parameters $\theta$i and $t_U$ of the element isolating oxide film are optimized, so that an unetched portion does not remain at an etching step for patterning the gate electrode layer to be formed later. This prevents short-circuit of the gate electrode. Since the element isolating oxide film has the improved flatness, a quantity of overetching in an active region can be reduced at a step of patterning the gate electrode layer. This prevents shaving of the gate oxide film and the underlying substrate surface.

The method of manufacturing the semiconductor device of another aspect can easily form the element isolating oxide film of which upper flatness is improved while intended isolating properties are maintained and the bird's beak length is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an element isolating oxide film formed at a predetermined region on a main surface of a semiconductor substrate, said element isolating oxide film including a substantially constant thickness portion and a thickness changing portion, the thickness changing portion including a first portion near the gate insulating film with a relatively small acute angle, not greater than 45°, between the lower surface of the first portion and the lower surface of the gate insulating film, and a second portion near the substantially constant thickness portion with a relatively large acute angle, greater than the relatively small acute angle, between the lower surface of the second portion and the lower surface of the gate insulating film;

a gate insulating film formed at a predetermined region in a region on the main surface of said semiconductor substrate not covered with said element isolating oxide film; and a gate electrode layer extending over said element isolating oxide film and said gate insulating film, wherein assuming that $t_G$ is a thickness of said gate electrode layer, $t_U$ is a height from an upper surface of said gate insulating film to an upper surface of a thickest portion of said element isolating oxide film, and θi is an acute angle between the upper surface of said thickness changing portion and the upper surface of said gate insulating film, said θi and said $t_U$ are within the following ranges;

$0 \leq \theta i \leq 56.6°$ $0 \leq t_U \leq 0.82 t_G$.

2. The semiconductor device according to claim 1, wherein
said gate electrode layer has a thickness within a range from 200 Å to 5000 Å.

3. The semiconductor device according to claim 1, wherein
an acute angle defined between a lower surface of a bird's beak of said element isolating oxide film and a lower surface of said gate insulating film at a connection between said bird's beak and a portion other than said bird's beak is smaller than an acute angle defined between a lower surface of the portion other than said bird's beak and the lower surface of said gate insulating film at the connection between said bird's beak and the portion other than said bird's beak.

4. The semiconductor device according to claim 1, wherein
a thickness from the upper surface of said gate insulating film to the upper surface of the thickest portion of said element isolating oxide film is smaller than a thickness from a lower surface of said gate insulating film to a lower surface of the thickest portion of said element isolating oxide film.

5. The semiconductor device according to claim 1, wherein
a channel stopper layer is formed under a lower surface of said element isolating oxide film.

* * * * *